United States Patent
Xu et al.

(10) Patent No.: US 11,502,019 B2
(45) Date of Patent: *Nov. 15, 2022

(54) HEAT SINK, HEAT DISSIPATION APPARATUS, HEAT DISSIPATION SYSTEM, AND COMMUNICATIONS DEVICE

(71) Applicant: HUAWEI TECHNOLOGIES CO., LTD., Guangdong (CN)

(72) Inventors: Shoubiao Xu, Shenzhen (CN); Shanjiu Chi, Shenzhen (CN); Wenhui Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/320,533

(22) Filed: May 14, 2021

(65) Prior Publication Data
US 2021/0343621 A1  Nov. 4, 2021

Related U.S. Application Data

(63) Continuation of application No. 16/298,443, filed on Mar. 11, 2019, now Pat. No. 11,043,442, which is a
(Continued)

(30) Foreign Application Priority Data

Sep. 12, 2016  (CN) .......................... 201610820551.1

(51) Int. Cl.
*H01L 23/00* (2006.01)
*H01L 23/40* (2006.01)
(Continued)

(52) U.S. Cl.
CPC ............ *H01L 23/4006* (2013.01); *F28F 3/06* (2013.01); *H01L 23/427* (2013.01);
(Continued)

(58) Field of Classification Search
CPC .............. H01L 23/367; H01L 23/4006; H01L 2023/405; H01L 2023/4043; H01L 2023/4081; H01L 2023/4087
See application file for complete search history.

(56) References Cited

U.S. PATENT DOCUMENTS 11,043,442 B2 *  6/2021  Xu ........................ H01L 23/427
2004/0155251 A1  8/2004  Abramov et al.
(Continued)

FOREIGN PATENT DOCUMENTS

CN  2704113  6/2005
CN  2840168  11/2006
(Continued)

OTHER PUBLICATIONS

Chinese Office Action issued in Chinese Application No. 201610820551.1 dated Mar. 29, 2018, 40 pages.
(Continued)

*Primary Examiner* — Reema Patel
(74) *Attorney, Agent, or Firm* — Fish & Richardson P.C.

(57) ABSTRACT

One example heat sink includes a heat dissipation substrate, a connector, and a fastener. The heat dissipation substrate is configured to dissipate heat for a packaged chip located on a circuit board, and the heat dissipation substrate is located on a surface that is of the packaged chip and that is opposite to the circuit board. A first heat dissipation substrate and a second heat dissipation substrate of the heat dissipation substrate each have a heat conduction surface that conducts heat with a chip in the packaged chip. Different heat conduction surfaces correspond to different chips.

21 Claims, 9 Drawing Sheets

Related U.S. Application Data continuation of application No. PCT/CN2017/100378, filed on Sep. 4, 2017.

(51) Int. Cl.
  *H01L 23/467* (2006.01)
  *H01L 23/427* (2006.01)
  *H05K 7/20* (2006.01)
  *F28F 3/06* (2006.01)

(52) U.S. Cl.
  CPC ............ *H01L 23/467* (2013.01); *H05K 7/20* (2013.01); *F28F 2280/02* (2013.01); *H01L 2023/405* (2013.01); *H01L 2023/4031* (2013.01); *H01L 2023/4056* (2013.01); *H01L 2023/4062* (2013.01); *H01L 2023/4081* (2013.01); *H01L 2023/4087* (2013.01)

(56) References Cited

U.S. PATENT DOCUMENTS

| | | |
|---|---|---|
| 2005/0207115 A1 | 9/2005 | Barsun et al. |
| 2007/0290330 A1 | 12/2007 | Reents |
| 2008/0068805 A1 | 3/2008 | Xu et al. |
| 2008/0218964 A1 | 9/2008 | Chang |
| 2009/0168355 A1 | 7/2009 | Ma et al. |
| 2009/0223647 A1 | 9/2009 | Alousi et al. |
| 2012/0300406 A1 | 11/2012 | Fukui et al. |
| 2013/0043581 A1 | 2/2013 | Negoro |
| 2013/0153193 A1 | 6/2013 | Li et al. |
| 2014/0002989 A1 | 1/2014 | Ahuja et al. |
| 2014/0069611 A1 | 3/2014 | Liu et al. |
| 2016/0118315 A1 | 4/2016 | Smith et al. |
| 2016/0284622 A1 | 9/2016 | Mitsui |

FOREIGN PATENT DOCUMENTS

| | | |
|---|---|---|
| CN | 2872593 | 2/2007 |
| CN | 101018464 | 8/2007 |
| CN | 101079399 | 11/2007 |
| CN | 102299127 | 12/2011 |
| CN | 102449759 | 5/2012 |
| CN | 102754202 | 10/2012 |
| CN | 203261623 | 10/2013 |
| CN | 103796475 | 5/2014 |
| CN | 104538434 | 4/2015 |
| CN | 204807901 | 11/2015 |
| CN | 105472942 | 4/2016 |
| CN | 106413343 | 2/2017 |
| JP | H08222672 | 8/1996 |
| JP | 2007208116 | 8/2007 |
| WO | 2015198642 | 12/2015 |

OTHER PUBLICATIONS

Extended European Search Report issued in European Application No. 17848106.5 dated Aug. 22, 2019, 12 pages.

International Search Report and Written Opinion issued in International Application No. PCT/CN2017/100378 dated Nov. 30, 2017, 20 pages.

* cited by examiner

HEAT SINK, HEAT DISSIPATION APPARATUS, HEAT DISSIPATION SYSTEM, AND COMMUNICATIONS DEVICE

CROSS-REFERENCE TO RELATED DISCLOSURES

This application is a continuation of U.S. patent application Ser. No. 16/298,443, filed on Mar. 11, 2019, which is a continuation of International Application No. PCT/CN2017/100378, filed on Sep. 4, 2017, which claims priority to Chinese Patent Application No. 201610820551.1, filed on Sep. 12, 2016. All of the afore-mentioned patent applications are hereby incorporated by reference in their entireties.

TECHNICAL FIELD

This disclosure relates to heat dissipation technologies, and in particular, to a heat sink, a heat dissipation apparatus, a heat dissipation system, and a communications device.

BACKGROUND

As science and technologies advance, to reduce sizes of electronic products, package sizes of chips used to construct electronic products need to be reduced. That is, a plurality of chips are packaged in a same package body, to effectively reduce a package size of chips, and reduce sizes of electronic products. How to effectively dissipate heat for the plurality of chips is an existing problem that needs to be urgently resolved.

SUMMARY

Embodiments of this disclosure provide a heat sink, a heat dissipation apparatus, a heat dissipation system, and a communications device, to overcome a prior-art problem that heat of each chip in a packaged chip cannot be properly and effectively dissipated, and as a result, a service life of a chip having a relatively low temperature is reduced, and a service life of an electronic product is reduced.

According to a first aspect of this disclosure, a heat sink is provided, including:

a heat dissipation substrate, a connector, and a fastener, where the heat dissipation substrate is configured to dissipate heat for a packaged chip located on a circuit board, and the heat dissipation substrate is located on a surface that is of the packaged chip and that is opposite to the circuit board; and the heat dissipation substrate includes a first heat dissipation substrate and a second heat dissipation substrate, the first heat dissipation substrate and the second heat dissipation substrate each have a heat conduction surface that conducts heat with a chip in the packaged chip, different heat conduction surfaces correspond to different chips, a first end of the connector is fastened to the first heat dissipation substrate, a second end of the connector suspends on an outer side of the second heat dissipation substrate, and the fastener presses against an outer side of the first heat dissipation substrate, to prevent the first heat dissipation substrate from moving far away from the second heat dissipation substrate.

In this embodiment, different heat dissipation substrates of the heat sink may separately dissipate heat for different chips in the packaged chip, and the different heat dissipation substrates are connected by using the connector. Therefore, neighboring heat dissipation substrates can conduct heat only by using the connector, and have a relatively slow heat conduction speed, thereby effectively obstructing heat conduction between the neighboring heat dissipation substrates. When temperatures of chips below heat dissipation substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

In some embodiments of the first aspect, the heat conduction surfaces of the first heat dissipation substrate and the second heat dissipation substrate are both in a same plane.

In this embodiment, because surfaces that are of chips in the packaged chip and that are away from the circuit board are all in the same plane, the heat conduction surfaces of the first heat dissipation substrate and the second heat dissipation substrate are both in the same plane. Therefore, this can ensure that the heat conduction surfaces of the heat dissipation substrates all are in contact with each chip in the packaged chip, and avoid that the heat dissipation substrates are undesirably in contact with the packaged chip.

In some embodiments of the first aspect, the connector is of an elongated shape.

In some other embodiments of the first aspect, the connector is sheet-shaped.

In the foregoing embodiment, when the connector is of an elongated shape or sheet-shaped, the connector may be joined between the first heat dissipation substrate and the second heat dissipation substrate. Because a cross-sectional area of the connector of an elongated shape or a sheet-shaped connector is relatively small in a length direction, less heat can be conducted per unit time based on a heat conduction law, that is, a heat conduction speed is slow. In this way, because the length direction of the connector is usually a heat transfer direction, the cross-sectional area of the connector in this direction is generally less than a cross-sectional area of a connected part formed when the first heat dissipation substrate and the second heat dissipation substrate are directly connected. A first connection surface may be defined as a surface that is on the first heat dissipation substrate and that is opposite to the second heat dissipation substrate, and a second connection surface may be defined as a surface that is on the second heat dissipation substrate and that is opposite to the first heat dissipation substrate. Generally, the cross-sectional area of the connector in a heat conduction direction of the connector should be less than an overlapped area of the first connection surface and the second connection surface. It should be noted that the shape of the connector is not limited to an elongated shape or a sheet shape, and may alternatively be another structural form having a relatively small cross-sectional area.

In some embodiments of the first aspect, an arrangement groove is provided at a position that is on the second heat dissipation substrate and that corresponds to the connector, and the arrangement groove is used to avoid the connector.

In this embodiment, because the second end of the connector suspends on the outer side of the second heat dissipation substrate, to avoid interference between the connector and the second heat dissipation substrate and further stably fasten the connector, the second heat dissipation substrate is provided with the arrangement groove. A size and a depth of the arrangement groove both match the connector, so that the second end of the connector can be placed in the arrangement groove to avoid interference between the connector and the second heat dissipation substrate. In addition, a shape of the arrangement groove can fasten and position the connector in a direction parallel to the heat dissipation substrate.

In some embodiments of the first aspect, there are at least two connectors. When there are a plurality of connectors, the plurality of connectors may be symmetrically disposed on two sides of the first heat dissipation substrate, to strengthen stability of connection between the first heat dissipation substrate and the second heat dissipation substrate.

In some embodiments of the first aspect, the connector is provided with a first through hole, and a second through hole is provided at a position that is on the second heat dissipation substrate and that corresponds to the first through hole. In this case, the fastener further includes a fastening screw, the fastening screw passes through the first through hole and the second through hole, the first heat dissipation substrate is located between a head portion of the fastening screw and the second heat dissipation substrate, and a tail portion of the fastening screw is securely connected to the second heat dissipation substrate, to connect the first heat dissipation substrate to the second heat dissipation substrate.

In this embodiment, because the fastening screw used to connect the connector to the second heat dissipation substrate implements fastening and connection by relying on a common threaded connection, a connection is relatively reliable. In addition, in a threaded connection, a through hole of the connector or the second heat dissipation substrate is generally in point contact with or is in line contact with a thread of the fastening screw, and a contact surface is relatively small. Therefore, this can further reduce a heat conduction speed of the connector and the second heat dissipation substrate, and ensure heat insulation performance of the first heat dissipation substrate and the second heat dissipation substrate.

Further, based on the foregoing embodiment, the fastener further includes an elastic member, and two ends of the elastic member respectively press between the head portion of the fastening screw and the first heat dissipation substrate, so that the first heat dissipation substrate is in contact with the packaged chip under an elastic force of the elastic member.

In this embodiment, the elastic member of the fastener can press against both the fastening screw and the first heat dissipation substrate. Because the fastening screw and the second heat dissipation substrate are securely connected, and maintain fixed relative positions, under the force of the elastic member, the first heat dissipation substrate is pressed to the second heat dissipation substrate under the force of the elastic member, to generate a movable effect. This can prevent the first heat dissipation substrate from moving far away from the second heat dissipation substrate, and the first heat dissipation substrate and the second heat dissipation substrate can keep being in contact with the packaged chip as much as possible. To be specific, the heat conduction surfaces of the first heat dissipation substrate and the second heat dissipation substrate are coplanar.

In some embodiments of the first aspect, the second heat dissipation substrate is connected to the second end of the connector by using heat insulation glue.

In this embodiment, the heat insulation glue is disposed between the second end of the connector and the second heat dissipation substrate, to obstruct heat transfer between the connector and the second heat dissipation substrate, and further avoid heat transfer between the first heat dissipation substrate and the second heat dissipation substrate.

In addition, in this embodiment, the second end of the connector may be soldered to the second heat dissipation substrate by using soldering tin, to implement fastening of the second end of the connector and the second heat dissipation substrate.

In some embodiments of the first aspect, the fastener includes: a first positioning stud and a second positioning stud; and a bottom end of the first positioning stud is connected to the second heat dissipation substrate, an axial direction of the first positioning stud is perpendicular to a plane in which the second heat dissipation substrate lies, the second positioning stud can be screwed into a top end of the first positioning stud, and the second end of the connector is fastened at a position at which the first positioning stud is screwed into the second positioning stud.

In this embodiment, a double-layer stud structure is used, a contact surface of the connector and the positioning stud is generally relatively small, and there is usually a gap. Therefore, a heat transfer speed and heat transfer efficiency of the connector and the positioning stud are both relatively low, and heat transfer to different heat dissipation substrates through the connector can be relatively desirably avoided.

In some embodiments of the first aspect, a perpendicular distance between the second end of the connector and the plane in which the second heat dissipation substrate lies is different from a perpendicular distance between the first end of the connector and the plane in which the second heat dissipation substrate lies.

In this embodiment, because the connector may be connected to the second heat dissipation substrate by using a structure such as a double-layer positioning stud, to avoid another connection structure, the second end and the first end of the connector may be generally located at positions away from the plane in which the second heat dissipation substrate lies by different distances, so that the second end of the connector avoids the connection structure for fastening.

In some embodiments of the first aspect, the first end of the connector is connected to the second end of the connector by using a bending segment.

In some embodiments of the first aspect, the second heat dissipation substrate is provided with a notch, at least a part of the first heat dissipation substrate is located in the notch, and an outer-edge shape of the part of the first heat dissipation substrate that is located in the notch matches a shape of the notch.

In this embodiment, because the second heat dissipation substrate is provided with the notch, at least the part of the first heat dissipation substrate can enter the notch, so that the position of the heat dissipation substrate can better correspond to positions of different chips in the packaged chip, and an overall area and an overall size of the heat dissipation substrate are reduced.

In some embodiments of the first aspect, the first heat dissipation substrate is completely located in the notch.

In some embodiments of the first aspect, the second heat dissipation substrate encloses the outer side of the first heat dissipation substrate and forms a closed shape.

In some embodiments of the first aspect, the heat sink further includes: a first heat dissipation fin group used to dissipate heat for the first heat dissipation substrate and a second heat dissipation fin group used to dissipate heat for the second heat dissipation substrate, the first heat dissipation fin group is located on a surface that is of the first heat dissipation substrate and that is opposite to the heat conduction surface, the second heat dissipation fin group is located on a surface that is of the second heat dissipation substrate and that is opposite to the heat conduction surface, a cold air path is formed inside the second heat dissipation fin group, the second heat dissipation fin group is provided with second heat dissipation fins, the second heat dissipation fin is located on two sides of the cold air path, and the first heat dissipation fin group is located in the cold air path or on an extension line of the cold air path.

In this embodiment, each heat dissipation substrate of the heat sink is further connected to a heat dissipation fin group that dissipates heat for the heat dissipation substrate. The second heat dissipation fin group on the second heat dissipation substrate is provided with a cold air path passing through the entire second heat dissipation fin group, so that an external cooling airflow can be blown to the first heat dissipation fin group through the cold air path, and the first heat dissipation fin group and the second heat dissipation fin group both have relatively high heat dissipation efficiency.

In some implementations of the first aspect, third heat dissipation fins are further disposed in the cold air path, and a height of the third heat dissipation fin is less than a height of the second heat dissipation fin.

In this embodiment, the third heat dissipation fin can assist heat dissipation. In addition, because the height of the third heat dissipation fin is relatively low, it can still be ensured that cooling airflow can pass through the cold air path.

In some implementations of the first aspect, fourth heat dissipation fins are further disposed in the cold air path, and a density of the fourth heat dissipation fins is less than a density of the second heat dissipation fins.

In this embodiment, the fourth heat dissipation fin in the cold air path can assist heat dissipation of the second heat dissipation substrate. In addition, a density of the fourth heat dissipation fins is less than a density of the second heat dissipation fins, and it can still be ensured that cooling airflow can pass through the cold air path.

In some implementations of the first aspect, the heat sink further includes: a fifth heat dissipation fin group used to dissipate heat for the first heat dissipation substrate and a sixth heat dissipation fin group used to dissipate heat for the second heat dissipation substrate, and the fifth heat dissipation fin group and the sixth heat dissipation fin group are stacked on a surface that is of the heat dissipation substrate and that is opposite to the heat conduction surface; and the fifth heat dissipation fin group is located between the sixth heat dissipation fin group and the heat dissipation substrate, or the sixth heat dissipation fin group is located between the fifth heat dissipation fin group and the heat dissipation substrate.

In this embodiment, the heat dissipation fin groups respectively used to dissipate heat for the two heat dissipation substrates are stacked on the heat dissipation substrates from top to bottom, so that when an area of the heat dissipation substrate is relatively small and it is difficult to form an effective cold air path, height space above the heat dissipation substrate can be used to dispose the heat dissipation fin group, to ensure heat dissipation efficiency of the heat dissipation substrate.

In some implementations of the first aspect, a semiconductor cooling chip is disposed on the heat conduction surface of the at least one heat dissipation substrate, and the semiconductor cooling chip is in contact with a corresponding chip in the packaged chip.

In this embodiment, the semiconductor cooling chip is disposed on the heat conduction surface of the heat dissipation substrate, so that a heat transfer speed of the heat conduction surface may be increased, and heat dissipation efficiency of the heat sink may be improved by using a feature of electron mobility of a semiconductor. In addition, alternatively, a heat conduction speed of the heat conduction surface of the heat dissipation substrate may be increased by using a cooling chip of another principle.

In some implementations of the first aspect, a heat conduction rate of a material that the connector is made of is less than a heat conduction rate of a material that the heat dissipation substrate is made of.

In this embodiment, because the heat conduction rate of the connector is less than the heat conduction rate of the heat dissipation substrate, a heat conduction speed of the connector is further reduced, and a heat insulation level of different heat dissipation substrates is improved.

According to a second aspect of this disclosure, a heat sink is provided, including a heat dissipation substrate, where the heat dissipation substrate is configured to dissipate heat for a packaged chip located on a circuit board, and the heat dissipation substrate is located on a surface that is of the packaged chip and that is opposite to the circuit board; and the heat dissipation substrate includes a first heat dissipation substrate and a second heat dissipation substrate, the first heat dissipation substrate and the second heat dissipation substrate each have a heat conduction surface that conducts heat with a chip in the packaged chip, different heat conduction surfaces correspond to different chips, the first heat dissipation substrate is connected to the second heat dissipation substrate by using a connector, a heat conduction coefficient of the connector is less than a heat conduction coefficient of the first heat dissipation sub-substrate, and the heat conduction coefficient of the connector is less than a heat conduction coefficient of the second heat dissipation substrate.

In this embodiment, the plurality of heat dissipation substrates that dissipate heat for different chips are connected by using the connector having a relatively low heat conduction coefficient. Because less heat is conducted between the heat dissipation substrates, when temperatures of chips below heat dissipation sub-substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

In some implementations of the second aspect, the heat conduction surfaces of the first heat dissipation substrate and the second heat dissipation substrate are both in a same plane.

In this embodiment, because surfaces that are of chips in the packaged chip and that are away from the circuit board are all in the same plane, the heat conduction surfaces of the first heat dissipation substrate and the second heat dissipation substrate are both in the same plane. Therefore, this can ensure that the heat conduction surfaces of the heat dissipation substrates all are in contact with each chip in the packaged chip, and avoid that the heat dissipation substrates are undesirably in contact with the packaged chip.

In some implementations of the second aspect, a material that the connector is made of is a heat-insulation material.

In this embodiment, the connector is made of the heat-insulation material, and a heat transfer process of the neighboring first heat dissipation substrates and second heat dissipation substrate can be alleviated to the maximum extent, so that an approximate heat insulation state exists between the different heat dissipation substrates, heat emitted by a chip having a high temperature is prevented from transferring to a chip having a low temperature, and a service life of the chip is increased.

In some implementations of the second aspect, an arrangement groove is provided at a position that is on the second heat dissipation substrate and that corresponds to the connector, and the arrangement groove is used to avoid the connector.

In this embodiment, because the second end of the connector suspends on the outer side of the second heat dissipation substrate, to avoid interference between the connector and the second heat dissipation substrate and further stably fasten the connector, the second heat dissipation substrate is provided with the arrangement groove. A size and a depth of the arrangement groove both match the connector, so that the second end of the connector can be placed in the arrangement groove to avoid interference between the connector and the second heat dissipation substrate. In addition, a shape of the arrangement groove can fasten and position the connector in a direction parallel to the heat dissipation substrate.

In some embodiments of the second aspect, there are at least two connectors. When there are a plurality of connectors, the plurality of connectors may be symmetrically disposed on two sides of the first heat dissipation substrate, to strengthen stability of connection between the first heat dissipation substrate and the second heat dissipation substrate.

In some embodiments of the second aspect, the connector is provided with a first through hole, and a second through hole is provided at a position that is on the second heat dissipation substrate and that corresponds to the first through hole. In this case, the fastener further includes a fastening screw, the fastening screw passes through the first through hole and the second through hole, the first heat dissipation substrate is located between a head portion of the fastening screw and the second heat dissipation substrate, and a tail portion of the fastening screw is securely connected to the second heat dissipation substrate, to connect the first heat dissipation substrate to the second heat dissipation substrate.

In this embodiment, because the fastening screw used to connect the connector to the second heat dissipation substrate implements fastening and connection by relying on a common threaded connection, a connection is relatively reliable. In addition, in a threaded connection, a through hole of the connector or the second heat dissipation substrate is generally in point contact with or is in line contact with a thread of the fastening screw, and a contact surface is relatively small. Therefore, this can further reduce a heat conduction speed of the connector and the second heat dissipation substrate, and ensure heat insulation performance of the first heat dissipation substrate and the second heat dissipation substrate.

Further, based on the foregoing embodiment, the fastener further includes an elastic member, and two ends of the elastic member respectively press between the head portion of the fastening screw and the first heat dissipation substrate, so that the first heat dissipation substrate is in contact with the packaged chip under an elastic force of the elastic member.

In this embodiment, the elastic member of the fastener can press against both the fastening screw and the first heat dissipation substrate. Because the fastening screw and the second heat dissipation substrate are securely connected, and maintain fixed relative positions, under the force of the elastic member, the first heat dissipation substrate is pressed to the second heat dissipation substrate under the force of the elastic member, to generate a floating effect. This can prevent the first heat dissipation substrate from moving far away from the second heat dissipation substrate, and the first heat dissipation substrate and the second heat dissipation substrate can keep being in contact with the packaged chip as much as possible. To be specific, the heat conduction surfaces of the first heat dissipation substrate and the second heat dissipation substrate are coplanar.

In some embodiments of the second aspect, the second heat dissipation substrate is connected to the connector by using heat insulation glue.

In this embodiment, the heat insulation glue is disposed between the connector and the second heat dissipation substrate, to obstruct heat transfer between the connector and the second heat dissipation substrate, and further avoid heat transfer between the first heat dissipation substrate and the second heat dissipation substrate.

In addition, in this embodiment, the connector may be soldered to the second heat dissipation substrate by using soldering tin, to implement fastening of the connector and the second heat dissipation substrate.

In some embodiments of the second aspect, the heat sink includes: a first positioning stud and a second positioning stud; and
a bottom end of the first positioning stud is connected to the second heat dissipation substrate, an axial direction of the first positioning stud is perpendicular to a plane in which the second heat dissipation substrate lies, the second positioning stud can be screwed into a top end of the first positioning stud, the first end of the connector is fastened to the first heat dissipation substrate, and the second end of the connector is fastened at a position at which the first positioning stud is screwed into the second positioning stud.

In this embodiment, a double-layer stud structure is used, the second end of the connector is fastened between the first positioning stud and the second positioning stud, and the first positioning stud is fastened on the second heat dissipation substrate. In this way, a connection between the connector and the second heat dissipation substrate is indirectly implemented by using the stud. A contact surface of the connector and the positioning stud is generally relatively small, and there is usually a gap. Therefore, a heat transfer speed and heat transfer efficiency of the connector and the positioning stud are both relatively low, and heat transfer to different heat dissipation substrates through the connector can be relatively desirably avoided.

In some embodiments of the second aspect, a perpendicular distance between the second end of the connector and the plane in which the second heat dissipation substrate lies is different from a perpendicular distance between the first end of the connector and the plane in which the second heat dissipation substrate lies.

In this embodiment, because the connector may be connected to the second heat dissipation substrate by using a structure such as a double-layer positioning stud, to avoid another connection structure, the second end and the first end of the connector may be generally located at positions away from the plane in which the second heat dissipation substrate lies by different distances, so that the second end of the connector avoids the connection structure for fastening.

In some embodiments of the second aspect, the first end of the connector is connected to the second end of the connector by using a bending segment.

In some embodiments of the second aspect, the second heat dissipation substrate is provided with a notch, at least a part of the first heat dissipation substrate is located in the notch, and an outer-edge shape of the part of the first heat dissipation substrate that is located in the notch matches a shape of the notch.

In this embodiment, because the second heat dissipation substrate is provided with the notch, at least the part of the first heat dissipation substrate can enter the notch, so that the position of the heat dissipation substrate can better correspond to positions of different chips in the packaged chip, and an overall area and an overall size of the heat dissipation substrate are reduced.

In some embodiments of the second aspect, the first heat dissipation substrate is completely located in the notch.

In some embodiments of the second aspect, the second heat dissipation substrate encloses the outer side of the first heat dissipation substrate and forms a closed shape.

In some embodiments of the second aspect, the heat sink further includes: a first heat dissipation fin group used to dissipate heat for the first heat dissipation substrate and a second heat dissipation fin group used to dissipate heat for the second heat dissipation substrate, the first heat dissipation fin group is located on a surface that is of the first heat dissipation substrate and that is opposite to the heat conduction surface, the second heat dissipation fin group is located on a surface that is of the second heat dissipation substrate and that is opposite to the heat conduction surface, a cold air path is formed inside the second heat dissipation fin group, the second heat dissipation fin group is provided with second heat dissipation fins, the second heat dissipation fin is located on two sides of the cold air path, and the first heat dissipation fin group is located in the cold air path or on an extension line of the cold air path.

In this embodiment, each heat dissipation substrate of the heat sink is further connected to a heat dissipation fin group that dissipates heat for the heat dissipation substrate. The second heat dissipation fin group on the second heat dissipation substrate is provided with a cold air path passing through the entire second heat dissipation fin group, so that an external cooling airflow can be blown to the first heat dissipation fin group through the cold air path, and the first heat dissipation fin group and the second heat dissipation fin group both have relatively high heat dissipation efficiency.

In some implementations of the second aspect, third heat dissipation fins are further disposed in the cold air path, and a height of the third heat dissipation fin is less than a height of the second heat dissipation fin.

In this embodiment, because the cold air path has the third heat dissipation fin having a relatively low height, the third heat dissipation fin can assist heat dissipation, and heat dissipation efficiency on the second heat dissipation substrate is ensured. In addition, because the height of the third heat dissipation fin is relatively low, it can still be ensured that cooling airflow can pass through the cold air path.

In some implementations of the second aspect, fourth heat dissipation fins are further disposed in the cold air path, and a density of the fourth heat dissipation fins is less than a density of the second heat dissipation fins.

In this embodiment, the fourth heat dissipation fin in the cold air path can assist heat dissipation of the second heat dissipation substrate. In addition, a density of the fourth heat dissipation fins is less than a density of the second heat dissipation fins, and it can still be ensured that cooling airflow can pass through the cold air path.

In some implementations of the second aspect, the heat sink further includes: a fifth heat dissipation fin group used to dissipate heat for the first heat dissipation substrate and a sixth heat dissipation fin group used to dissipate heat for the second heat dissipation substrate, and the fifth heat dissipation fin group and the sixth heat dissipation fin group are stacked on a surface that is of the heat dissipation substrate and that is opposite to the heat conduction surface; and the fifth heat dissipation fin group is located between the sixth heat dissipation fin group and the heat dissipation substrate, or the sixth heat dissipation fin group is located between the fifth heat dissipation fin group and the heat dissipation substrate.

In this embodiment, the heat dissipation fin groups respectively used to dissipate heat for the two heat dissipation substrates are stacked on the heat dissipation substrates from top to bottom, so that when an area of the heat dissipation substrate is relatively small and it is difficult to form an effective cold air path, height space above the heat dissipation substrate can be used to dispose the heat dissipation fin group, to ensure heat dissipation efficiency of the heat dissipation substrate.

In some implementations of the second aspect, a semiconductor cooling chip is disposed on the heat conduction surface of the at least one heat dissipation substrate, and the semiconductor cooling chip is in contact with a corresponding chip in the packaged chip.

In this embodiment, the semiconductor cooling chip is disposed on the heat conduction surface of the heat dissipation substrate, so that a heat transfer speed of the heat conduction surface may be increased, and heat dissipation efficiency of the heat sink may be improved by using a feature of electron mobility of a semiconductor. In addition, alternatively, a heat conduction speed of the heat conduction surface of the heat dissipation substrate may be increased by using a cooling chip of another principle.

According to a third aspect of this disclosure, a heat dissipation apparatus is provided, including at least two heat sinks according to any one of the first aspect or the second aspect and at least one heat pipe, where each heat sink corresponds to a packaged chip; and two ends of the heat pipe are respectively connected to heat dissipation substrates of different heat sinks, to transfer heat of a heat sink corresponding to a packaged chip in a heat emitting state to a heat sink corresponding to a packaged chip that does not emit heat.

In this embodiment, different heat sinks are connected by using the at least one heat pipe, and heat of a packaged chip that is in a working and heat emitting state may be transferred, by using the connection between the heat sink and the heat pipe, to a heat sink corresponding to a packaged chip that does not work or does not emit heat, to more effectively facilitate temperature reduction of different packaged chips.

According to a fourth aspect of this disclosure, a heat dissipation system is provided, including: at least one heat sink according to any one of the first aspect or the second aspect and at least one packaged chip, where each heat sink corresponds to a packaged chip; and the heat sink is used to dissipate heat for the packaged chip.

In this embodiment, each packaged chip is provided with a heat sink, different heat dissipation substrates of the heat sink may dissipate heat for different chips in the packaged chip, so that when heat of the chips in the packaged chip is different, heat of each chip is independently and effectively dissipated, to ensure normal working and a service life of each chip in the packaged chip.

According to a fifth aspect of this disclosure, a communications device is provided, including at least one heat sink according to any one of the first aspect or the second aspect, at least one packaged chip, and at least one circuit board, where each circuit board is provided with at least one packaged chip; and each heat sink corresponds to a packaged chip, and the heat sink is used to dissipate heat for the packaged chip.

In this embodiment, a packaged chip on the circuit board in the communications device is provided with a heat sink, different heat dissipation substrates of the heat sink may dissipate heat for different chips in the packaged chip, so that when heat of the chips in the packaged chip is different, heat of each chip is independently and effectively dissipated, to ensure normal working and a service life of each chip in the packaged chip.

This disclosure provides the heat sink, the heat dissipation apparatus, the heat dissipation system, and the communications device. The heat sink includes: the heat dissipation substrate, the connector, and the fastener, where the heat dissipation substrate is configured to dissipate heat for a packaged chip located on the circuit board, and the heat dissipation substrate is located on the surface that is of the packaged chip and that is opposite to the circuit board; and the heat dissipation substrate includes the first heat dissipation substrate and the second heat dissipation substrate, the first heat dissipation substrate and the second heat dissipation substrate each have the heat conduction surface that conducts heat with a chip in the packaged chip, different heat conduction surfaces correspond to different chips, the first end of the connector is fastened to the first heat dissipation substrate, the second end of the connector suspends on the outer side of the second heat dissipation substrate, and the fastener presses against the outer side of the first heat dissipation substrate, to prevent the first heat dissipation substrate from moving far away from the second heat dissipation substrate. When temperatures of chips below heat dissipation substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

DESCRIPTION OF EMBODIMENTS

Figure 1:
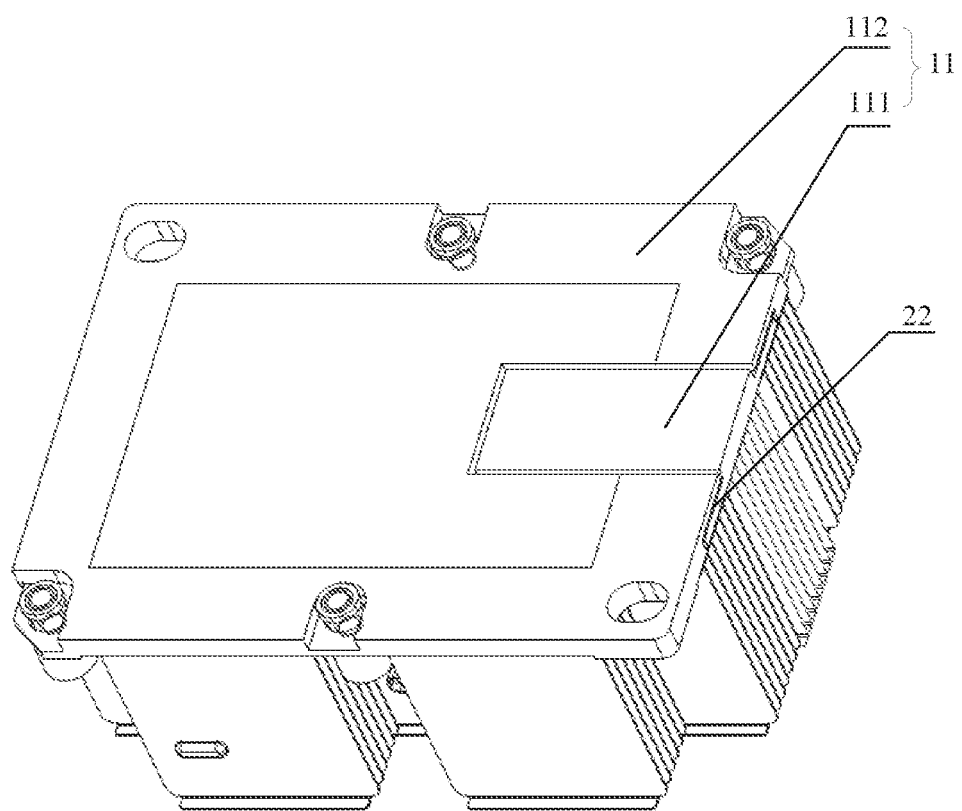
FIG. 1 is an outline diagram of a heat sink according to Embodiment 1 of this disclosure.

A chip may include various electronic circuit components, and may be used to construct an electronic product, for example, a computer or a mobile terminal.

As science and technologies advance, light weights and small sizes already become development trends of electronic products. Therefore, a size of chip package in electronic products also should be reduced. A multi-chip package body technology enabling chips having different functions to be packaged in a same package body conforms to the development trends of electronic products because a high capacity and a multi-function operation are implemented in a single packaged product. For example, a system in package (SIP) technology can enable a plurality of chips having different functions to be disposed on a same substrate, thereby effectively packaging the plurality of chips into a package body having a small size. For example, a microprocessor, a memory (for example, an erasable programmable read-only memory (EPROM) and a dynamic random access memory (DRAM), a field-programmable gate array (FPGA), a resistor, a capacitor, and an inductor may be combined in a package body accommodating up to four or five bare dies.

In development towards electronic products having light weights and small sizes, working reliability of devices in electronic products is also a problem that needs to be paid attention to.

Because working temperatures of chips are different during normal working, if neighboring chips in the packaged chip (a plurality of chips are packaged in one package body) obtained by system in package transfer heat, and to be specific, heat emitted by a chip having a relatively high temperature transfers to a chip having a relatively low temperature, a temperature of the chip having the relatively low temperature is higher than a temperature of the chip during normal working. As a result, a service life of the chip having the relatively low temperature is reduced, and a service life of an electronic product is reduced.

A heat dissipation apparatus in the prior art includes a heat dissipation substrate and a heat dissipation fin provided on the heat dissipation substrate. During use, the heat dissipation apparatus is fastened above a package body of chips, so that the heat dissipation substrate of the heat dissipation apparatus is in contact with a surface of the package body of the chips, heat emitted by the chips transfers to the heat dissipation fin, and the heat dissipation fin finally dissipates the heat. However, heat emitted by each chip in the same package body cannot be effectively dissipated simultaneously, and the heat dissipation substrate transfers heat emitted by a chip having a relatively high temperature to a chip having a relatively low temperature. As a result, a service life of a chip having a relatively low temperature is reduced, and a service life of an electronic product is reduced.

In this disclosure, a heat dissipation substrate of a heat dissipation apparatus is divided into different heat dissipation sub-substrates, each sub-substrate corresponds to one chip in a packaged chip and is configured to dissipate heat for the chip, and sub-substrates do not conduct heat, so that heat generated by a chip having a relatively high temperature does not transfer to a chip having a relatively low temperature. Therefore, a service life of a chip having a relatively low temperature is effectively increased, and a service life of an electronic product is increased.

This disclosure is applied to a device such as a packaged chip obtained by packaging a plurality of different chips into a same package body.

Specific embodiments are used below to describe in detail the technical solutions of this disclosure. The following several specific embodiments may be combined with each other, and a same or similar concept or process may not be described repeatedly in some embodiments.

Figure 2:
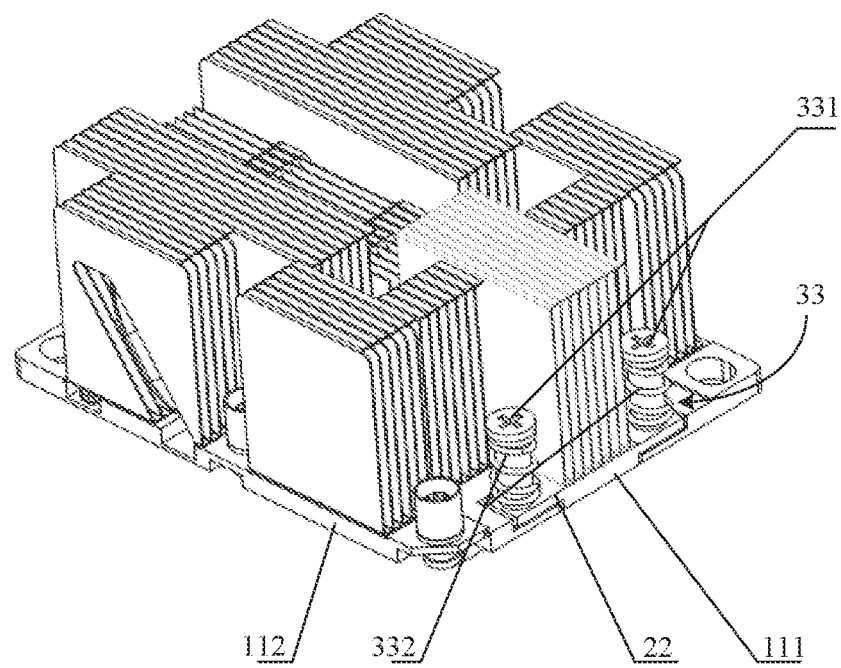
FIG. 2 is a schematic structural diagram of a heat sink according to Embodiment 1 of this disclosure.
Figure 3:
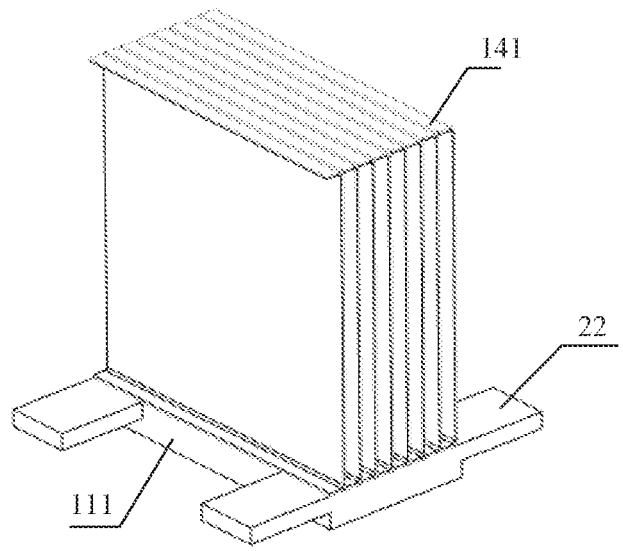
FIG. 3 is a specific schematic structural diagram of a first heat dissipation substrate of the heat sink shown in FIG. 2.
Figure 4:
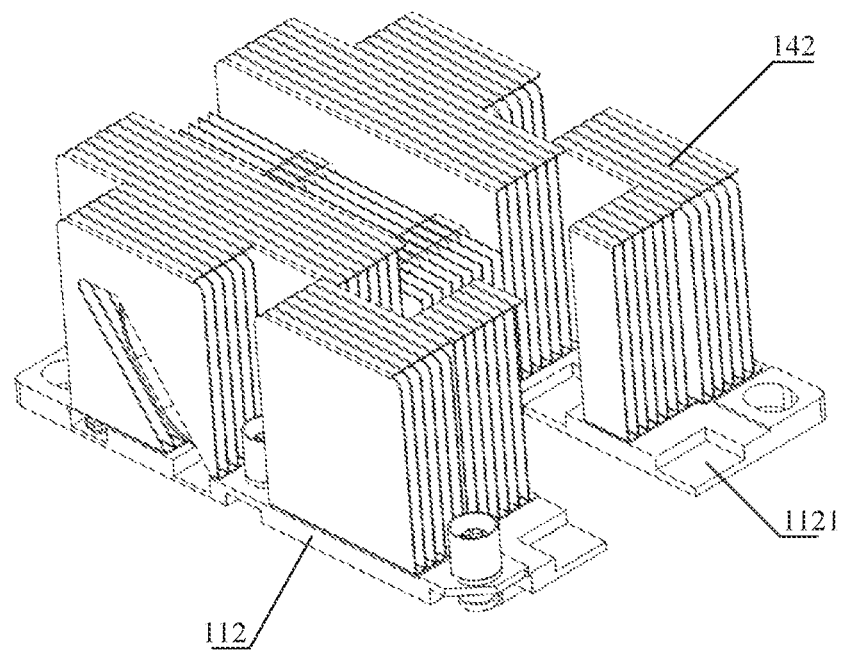
FIG. 4 is a specific schematic structural diagram of a second heat dissipation substrate of the heat sink shown in FIG. 2.

FIG. 1 is an outline diagram of a heat sink according to Embodiment 1 of this disclosure. FIG. 2 is a schematic structural diagram of a heat sink according to Embodiment 1 of this disclosure. FIG. 3 is a specific schematic structural diagram of a first heat dissipation substrate of the heat sink shown in FIG. 2. FIG. 4 is a specific schematic structural diagram of a second heat dissipation substrate of the heat sink shown in FIG. 2. As shown in FIG. 1 to FIG. 4, the heat sink in the embodiments may include a heat dissipation substrate 11, a connector 22, and a fastener 33, where the heat dissipation substrate 11 is used to dissipate heat for a packaged chip located on a circuit board, and the heat dissipation substrate 11 is located on a surface that is of the packaged chip and that is opposite to the circuit board; and the heat dissipation substrate 11 is usually made of a material such as aluminum and copper having relatively desirable heat conductivity, and the heat dissipation substrate includes a first heat dissipation substrate 111 and a second heat dissipation substrate 112, the first heat dissipation substrate 111 and the second heat dissipation substrate 112 each have a heat conduction surface that conducts heat with a chip in the packaged chip, different heat conduction surfaces correspond to different chips, a first end of the connector 22 is fastened to the first heat dissipation substrate 111, a second end of the connector 22 suspends on an outer side of the second heat dissipation substrate 112, and the fastener 33 presses against an outer side of the first heat dissipation substrate 111, to prevent the first heat dissipation substrate 111 from moving far away from the second heat dissipation substrate 112.

That a surface of the heat dissipation substrate is in contact with a corresponding chip in the packaged chip may be: each heat dissipation substrate corresponds to one chip in the packaged chip or may correspond to a plurality of chips in the packaged chip. In an implementable manner, when each heat dissipation substrate corresponds to a plurality of chips in the packaged chip, emitted heat and heat dissipation requirements of the plurality of chips corresponding to each heat dissipation substrate are similar or the same.

In an implementable manner of this disclosure, the heat conduction surfaces of the first heat dissipation substrate 111 and the second heat dissipation substrate 112 are both in a same plane. Because surfaces that are of chips in the packaged chip and that are away from the circuit board are all in the same plane, the heat conduction surfaces of the first heat dissipation substrate 111 and the second heat dissipation substrate 112 are both in the same plane. Therefore, this can ensure that the heat conduction surfaces of the heat dissipation substrates 11 all are in contact with each chip in the packaged chip, and avoid that the heat dissipation substrates 11 are undesirably in contact with the packaged chip and a single heat dissipation substrate is not in contact with a packaged chip.

In an implementable manner of this disclosure, the connector 22 is of an elongated shape. When the connector 22 is of an elongated shape, the connector 22 may be joined between the first heat dissipation substrate 111 and the second heat dissipation substrate 112. Because a cross-sectional area of a connector 22 of an elongated shape is relatively small in a length direction, less heat can be conducted per unit time based on a heat conduction law, that is, a heat conduction speed is slow. In this way, because the length direction of the connector 22 is usually a heat transfer direction, the cross-sectional area of the connector 22 in this direction is generally less than a cross-sectional area of a connected part formed when the first heat dissipation substrate 111 and the second heat dissipation substrate 112 are directly connected. A first connection surface may be defined as a surface that is on the first heat dissipation substrate 111 and that is opposite to the second heat dissipation substrate 112, and a second connection surface may be defined as a surface that is on the second heat dissipation substrate 112 and that is opposite to the first heat dissipation substrate 111. Generally, the cross-sectional area of the connector 22 in a heat conduction direction of the connector should be less than an overlapped area of the first connection surface and the second connection surface.

In another implementable manner of this disclosure, the connector 22 is sheet-shaped. The sheet-shaped connector 22 also has a relatively small cross-sectional area, and can effectively reduce a heat conduction speed of the connector 22, thereby obstructing a process of transferring heat between different heat dissipation substrates. Details are not described herein again. In addition, the sheet-shaped connector 22 may have a relatively large width while having a relatively small cross-sectional area, to facilitate a connection to a fastening structure such as the fastener 33.

It should be noted that the shape of the connector is not limited to an elongated shape or a sheet shape, and may alternatively be another structural form such as a hollow structure having a relatively small cross-sectional area.

In an implementable manner of this disclosure, an arrangement groove 1121 is provided at a position that is on the second heat dissipation substrate 112 and that corresponds to the connector 22, and the arrangement groove 1121 is used to avoid the connector 22.

Figure 5:
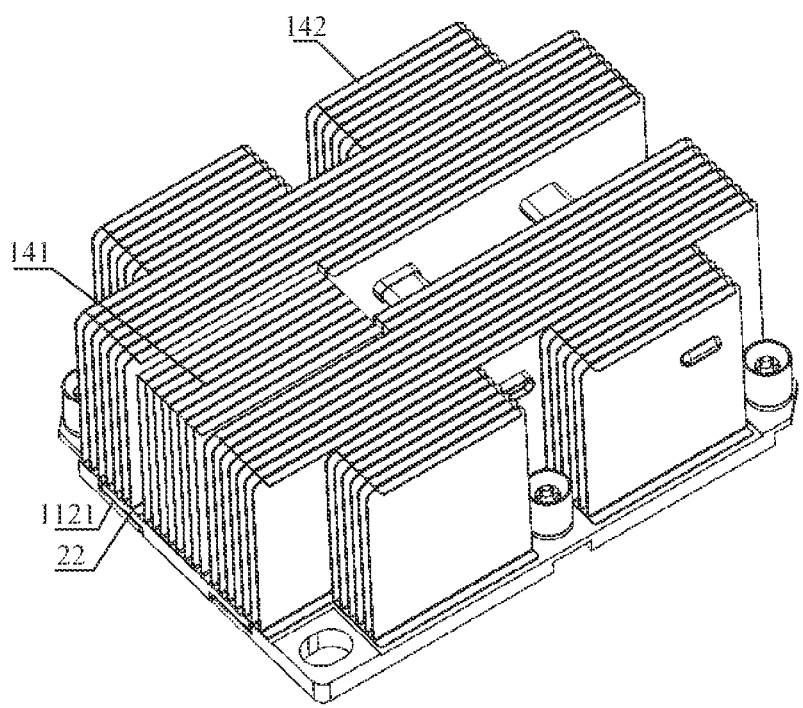
FIG. 5 is a schematic diagram of connection and fastening of a first heat dissipation substrate and a second heat dissipation substrate according to Embodiment 1 of this disclosure.

Because the second end of the connector 22 suspends on the outer side of the second heat dissipation substrate 112 when the first heat dissipation substrate 112 is connected to the second heat dissipation substrate 111, if the connector 22 is directly connected to the second heat dissipation substrate 112, a structure of the second heat dissipation substrate 112 may be interfered. FIG. 5 is a schematic diagram of connection and fastening of a first heat dissipation substrate and a second heat dissipation substrate according to Embodiment 1 of this disclosure. As shown in FIG. 5, to avoid interference between the connector 22 and the second heat dissipation substrate 112 while reducing a distance between neighboring heat dissipation substrates as much as possible, the second heat dissipation substrate 112 needs to be provided with the arrangement groove 1121. A size and a depth of the arrangement groove 1121 both match the connector 22, so that the second end of the connector 22 can be placed in the arrangement groove 1121 to avoid interference between the connector 22 and the second heat dissipation substrate 112. In addition, a shape of the arrangement groove 1121 can fasten and position the connector in a direction parallel to the heat dissipation substrate.

In an implementable manner of this disclosure, there are at least two connectors 22. When there are two or more connectors 22, the plurality of connectors may be symmetrically disposed on two sides of the first heat dissipation substrate, to strengthen stability of connection between the first heat dissipation substrate 111 and the second heat dissipation substrate 112. In this embodiment, four connectors 22 are specifically disposed, and the four connectors are separately connected on two sides of the first heat dissipation substrate 111. This disposing manner can effectively ensure fastening of the second heat dissipation substrate 112 and the first heat dissipation substrate 111.

To implement fastening of the connector 22 and the second heat dissipation substrate 112 and avoid disconnection of the first heat dissipation substrate 111 from the second heat dissipation substrate 112, the fastener 33 may have a plurality of different forms. In an implementable manner of this disclosure, the connector 22 is provided with a first through hole, and a second through hole is provided at a position that is on the second heat dissipation substrate 112 and that corresponds to the first through hole. In this case, the fastener 33 further includes a fastening screw 331, the fastening screw 331 passes through the first through hole and the second through hole, the first heat dissipation substrate 111 is located between a head portion of the fastening screw 331 and the second heat dissipation substrate 112, and a tail portion of the fastening screw 331 is securely connected to the second heat dissipation substrate 112, to connect the first heat dissipation substrate 111 to the second heat dissipation substrate 112.

Because there are a plurality of connectors 22, there may also be a plurality of fastening screws 331. A quantity of fastening screws 331 may be less than a quantity of connectors 22 as long as it is ensured that the fastening screws 331 can fasten the connectors 22. In this way, the quantity of the fastening screws 331 can be reduced, and it is avoided that disposing of another component is affected because the fastening screws 331 occupy excessive space.

In an actual disclosure, the fastening screw 331 may be further replaced with a fastener such as a bolt, and the first through hole and the second through hole may be threaded holes or holes without threads.

When at least one of the first through hole and the second through hole is a hole without a thread, the fastener 33 further includes a nut, and the connector is securely connected to the heat dissipation substrate by using cooperation between a screw and the nut.

Because the fastening screw 331 used to connect the connector 22 to the second heat dissipation substrate 112 implements fastening and connection by relying on a common threaded connection, a connection is relatively reliable. In addition, when the connector 22 implements a threaded connection by using the fastening screw 331, the fastening screw 331 passes through the through holes on the two different heat dissipation substrates. The first through hole of the connector 22 or the second through hole on the second heat dissipation substrate 112 is generally in point contact with or is in line contact with a thread of the fastening screw 331, and a contact surface is relatively small. Therefore, this can further reduce a heat conduction speed of the connector 22 and the second heat dissipation substrate 112, and ensure heat insulation performance of the first heat dissipation substrate 111 and the second heat dissipation substrate 112.

Based on the foregoing implementable manner, the fastener 33 may further include an elastic member 332, and two ends of the elastic member 332 respectively press between the head portion of the fastening screw 331 and the first heat dissipation substrate 111, so that the first heat dissipation substrate 111 is in contact with the packaged chip under an elastic force of the elastic member 332. Specifically, the elastic member 332 may be a conventional elastic element such as a spring, and when the elastic member 332 is a spring, the spring may be sleeved on the fastening screw 331. A fastening manner thereof is relatively simple.

The elastic member 332 of the fastener 33 can press against both the fastening screw 331 and the first heat dissipation substrate 111. In addition, the fastening screw 331 and the second heat dissipation substrate 112 are securely connected, and maintain fixed relative positions. Therefore, under the force of the elastic member 332, the first heat dissipation substrate 111 is pressed to the second heat dissipation substrate 112 under the force of the elastic member 332, to generate a floating effect. This can prevent the first heat dissipation substrate 111 from moving far away from the second heat dissipation substrate 112, and the first heat dissipation substrate 111 and the second heat dissipation substrate 112 can keep being in contact with the packaged chip as much as possible. To be specific, the heat conduction surfaces of the first heat dissipation substrate 111 and the second heat dissipation substrate 112 are coplanar.

In an implementable manner of this disclosure, the second heat dissipation substrate 112 is connected to the second end of the connector 22 by using heat insulation glue. Because the heat insulation glue is in a flowable state before solidifying, the heat insulation glue may be provided between the second heat dissipation substrate 112 and the second end of the connector 22 in a manner such as coating, and usage of the heat insulation glue may be freely set based on an actual requirement. In this way, the heat insulation glue is disposed between the connector 22 and the second heat dissipation substrate 112, to obstruct heat transfer between the connector 22 and the second heat dissipation substrate 112, and further avoid heat transfer between the first heat dissipation substrate 111 and the second heat dissipation substrate 112. It should be noted that the second heat dissipation substrate 112 may alternatively be glued to the second end of the connector 22 by using another adhesive, to ensure a fastening effect of the second heat dissipation substrate 112 and the second end of the connector 22.

In addition, the second end of the connector 22 may be soldered to the second heat dissipation substrate 112 in another fastening manner such as by using soldering tin, to implement fastening of the second end of the connector 22 and the second heat dissipation substrate 112. Because soldering tin has relatively high connection strength, soldering tin can effectively fasten the connector when being used for soldering and connection.

Figure 6:
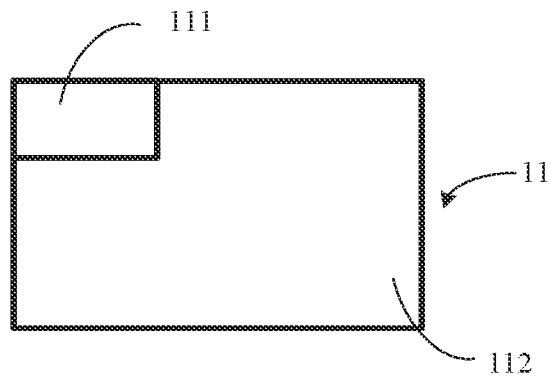
FIG. 6 is a diagram 1 of relative locations of a first heat dissipation substrate and a second heat dissipation substrate according to Embodiment 1 of this disclosure.
Figure 7:
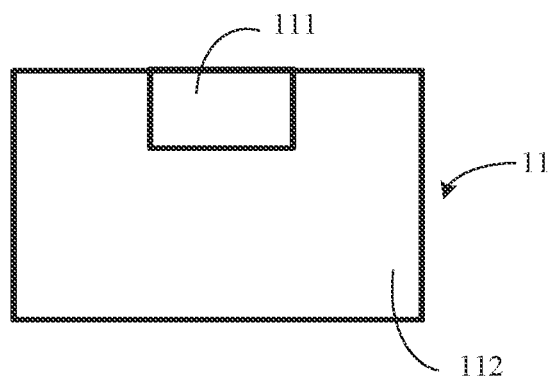
FIG. 7 is a diagram 2 of relative locations of a first heat dissipation substrate and a second heat dissipation substrate according to Embodiment 1 of this disclosure.
Figure 8:
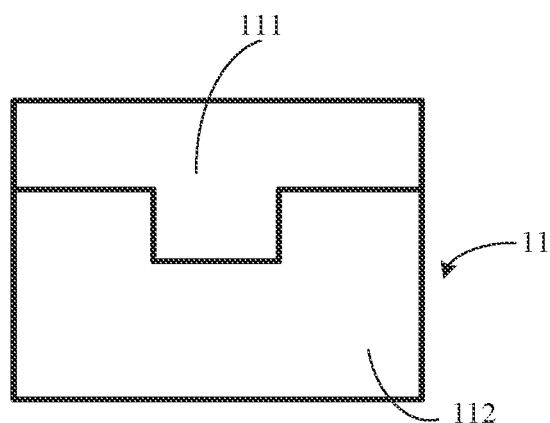
FIG. 8 is a diagram 3 of relative locations of a first heat dissipation substrate and a second heat dissipation substrate according to Embodiment 1 of this disclosure.

When the heat sink dissipates heat for the packaged chip, a structure of the packaged chip is relatively compact, and different chips have a plurality of possible positions in the packaged chip. Therefore, correspondingly, relative positions and structures of the heat dissipation substrates are also relatively diverse to adapt to heat dissipation requirements of different chips. For example, the second heat dissipation substrate 112 and the first heat dissipation substrate 111 may be provided in parallel with each other and do not interfere each other. Alternatively, the second heat dissipation substrate 112 may be provided with a notch, at least a part of the first heat dissipation substrate 111 is located in the notch, and an outer-edge shape of the part of the first heat dissipation substrate 111 that is located in the notch matches a shape of the notch. Generally, the first heat dissipation substrate 111 may be completely located in the notch of the second heat dissipation substrate 112. FIG. 6 is a diagram 1 of relative locations of a first heat dissipation substrate and a second heat dissipation substrate according to Embodiment 1 of this disclosure. FIG. 7 is a diagram 2 of relative locations of a first heat dissipation substrate and a second heat dissipation substrate according to Embodiment 1 of this disclosure. FIG. 8 is a diagram 3 of relative locations of a first heat dissipation substrate and a second heat dissipation substrate according to Embodiment 1 of this disclosure. As shown in FIG. 6, FIG. 7, and FIG. 8, the second heat dissipation substrate 112 is approximately a rectangular substrate, the edge of the second heat dissipation substrate 112 is provided with a notch, and at least the part of the first heat dissipation substrate 111 or the entire first heat dissipation substrate 111 is completely located in the notch. The outer-edge shape of the first heat dissipation substrate 111 matches the shape of the notch, and both are rectangles in the figures, so that the first heat dissipation substrate 111 and the second heat dissipation substrate 112 combine to form a large rectangle.

Because at least the part of the first heat dissipation substrate 111 is inserted into the notch of the second heat dissipation substrate 112, the structure formed by the first heat dissipation substrate 111 and the second heat dissipation substrate 112 is relatively compact, and a distance between the first heat dissipation substrate 111 and the second heat dissipation substrate 112 is relatively small. In this way, space can be effectively used, and when an area of the surface of the packaged chip is relatively small, the first heat dissipation substrate 111 and the second heat dissipation substrate 112 can correspondingly be in contact with each chip in the packaged chip accurately.

It should be noted that regardless of a manner in which the first heat dissipation substrate 111 and the second heat dissipation substrate 112 are arranged, it needs to be ensured that the heat conduction surfaces of the first heat dissipation substrate 111 and the second heat dissipation substrate 112 are in a same plane, to ensure desirable contact with the packaged chip, and avoid that heat dissipation efficiency is affected because the heat dissipation substrate is not in contact with a surface of a corresponding chip in the packaged chip.

Figure 9:
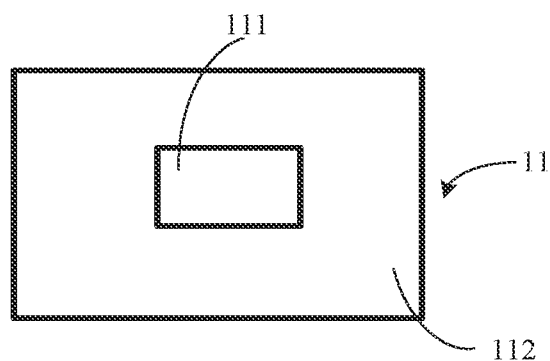
FIG. 9 is a diagram 4 of relative locations of a first heat dissipation sub-substrate and a second heat dissipation sub-substrate according to Embodiment 1 of this disclosure.

In an implementable manner of this disclosure, the first heat dissipation substrate 111 and the second heat dissipation substrate 112 may alternatively have an included relationship in the same plane. FIG. 9 is a diagram 4 of relative locations of a first heat dissipation sub-substrate and a second heat dissipation sub-substrate according to Embodiment 1 of this disclosure. As shown in FIG. 9, the second heat dissipation substrate 112 may enclose the outer side of the first heat dissipation substrate 111 and form a closed shape. This disposing manner is applied to a case in which positions of some chips in the packaged chip are relatively close to the center.

To conduct heat of the heat dissipation substrate to another place to achieve a better heat dissipation effect, the heat sink is provided with the heat dissipation fin connected to the heat dissipation substrate. The heat dissipation fin has a relatively large heat dissipation area, and can dissipate, by using an external cooling airflow, heat gathered on the heat dissipation fin.

During using, if heat dissipation fins of different heat dissipation substrates are connected to each other, for example, the heat dissipation fin of the first heat dissipation substrate 111 is connected to the heat dissipation fin of the second heat dissipation substrate 112, and heat gathered on the heat dissipation fin of the second heat dissipation substrate 112 is higher than heat of the heat dissipation fin of the first heat dissipation substrate 111, the heat dissipation fin of the second heat dissipation substrate 112 transfers heat to the heat dissipation fin of the first heat dissipation substrate 111, so that a temperature of the heat dissipation fin of the first heat dissipation substrate 111 increases, and heat dissipation of the first heat dissipation substrate 111 for the chip is affected. When a temperature of a chip continuously increases because of insufficient heat dissipation, normal working of the chip and a service life of the chip are affected.

To resolve the foregoing problem, the heat sink includes: a first heat dissipation fin group 141 used to dissipate heat for the first heat dissipation substrate 111 and a second heat dissipation fin group 142 used to dissipate heat for the second heat dissipation substrate 112, the first heat dissipation fin group 141 is located on a surface that is of the first heat dissipation substrate 11 and that is opposite to the heat conduction surface, the second heat dissipation fin group 142 is located on a surface that is of the second heat dissipation substrate 112 and that is opposite to the heat conduction surface, a cold air path 142a is formed inside the second heat dissipation fin group 142, the second heat dissipation fin group 142 is provided with second heat dissipation fins, the second heat dissipation fin is located on two sides of the cold air path 142a, and the first heat dissipation fin group 141 is located on the cold air path 142a or an extension line of the cold air path 142a.

Based on different relative positions of the first heat dissipation substrate 111 and the second heat dissipation substrate 112, the first heat dissipation fin group 141 may be located on the cold air path 142a in the second heat dissipation fin group 142 or an extension line at two ends of the cold air path 142a.

Specifically, each heat dissipation substrate of the heat sink is further connected to a heat dissipation fin group for dissipating heat for the heat dissipation substrate. When the heat dissipation fin group dissipates heat for the heat dissipation substrate, a cooling airflow may be blown into the heat dissipation fin group. The cooling airflow may be generated by an external air deflection structure, or may be generated by an active heat dissipation device such as a fan.

Figure 10:
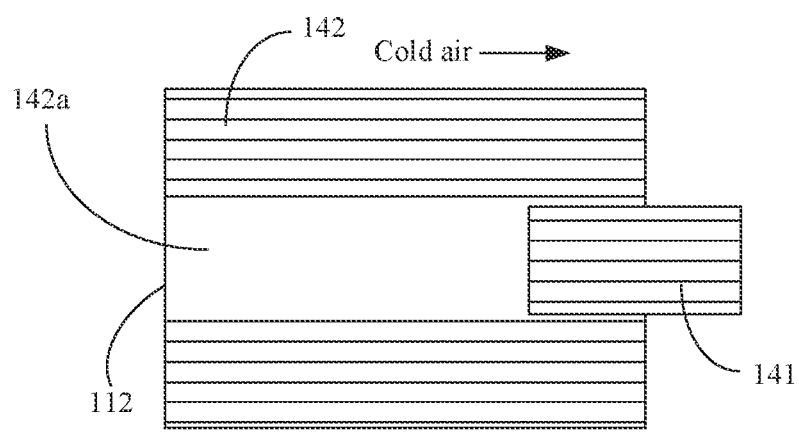
FIG. 10 is a schematic structural diagram 1 of a heat dissipation fin group according to Embodiment 1 of this disclosure.

FIG. 10 is a schematic structural diagram 1 of a heat dissipation fin group according to Embodiment 1 of this disclosure. As shown in FIG. 10, an airflow used to dissipate heat is generally blown from the second heat dissipation substrate 112 to the first heat dissipation substrate 111. In this case, the first heat dissipation substrate 111 is located downstream on an air channel, and the second heat dissipation substrate 112 is located upstream on the air channel, as shown in FIG. 10. To enable the first heat dissipation fin group 141 to be in contact with a cooling airflow, the second heat dissipation fin group 142 is provided with a cold air path 142a passing through the entire second heat dissipation fin group 142, so that an external cooling airflow can pass through the cold air path 142a and is blown to the first heat dissipation fin group 141. Because both the first heat dissipation fin group 141 and the second heat dissipation fin group 142 can be in contact with a cooling airflow, heat gathered on the heat dissipation fin groups can all be effectively dissipated, so that the first heat dissipation fin group 141 and the second heat dissipation fin group 142 both have relatively high heat dissipation efficiency, to avoid that heat on the first heat dissipation substrate 111 or the second heat dissipation substrate 112 cannot be dissipated in time and damages the packaged chip.

It should be noted that a specific shape and a specific structure of a single heat dissipation fin in each heat dissipation fin group may both be freely set, and this is not limited herein.

It should be noted that to achieve a better effect, an arrangement direction of the heat dissipation fin may be set to be the same as a direction from which cold air is blown in.

Figure 11:
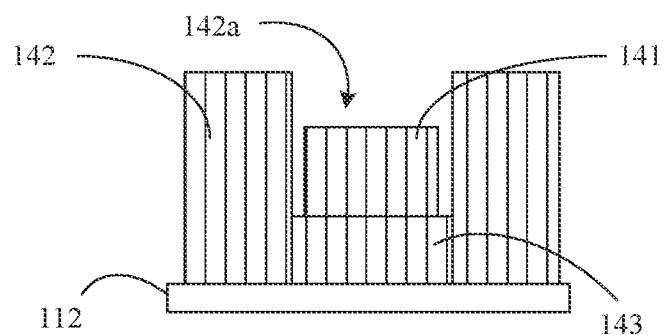
FIG. 11 is a schematic structural diagram 2 of a heat dissipation fin group according to Embodiment 1 of this disclosure.

FIG. 11 is a schematic structural diagram 2 of a heat dissipation fin group according to Embodiment 1 of this disclosure. In a possible implementation, to improve heat dissipation efficiency of a heat dissipation substrate, a third heat dissipation fin 143 is further disposed in the cold air path 142a in the second heat dissipation fin group 142, and a height of the third heat dissipation fin 143 is less than a height of the second heat dissipation fin, as shown in FIG. 11. Because the cold air path has the third heat dissipation fin 143 having a relatively low height, the third heat dissipation fin can assist heat dissipation of the heat dissipation substrate, and heat dissipation efficiency on the second heat dissipation substrate 112 is ensured. In addition, because the height of the third heat dissipation fin 143 is relatively low, it can still be ensured that cooling airflow can pass through the cold air path 142a.

Figure 12:
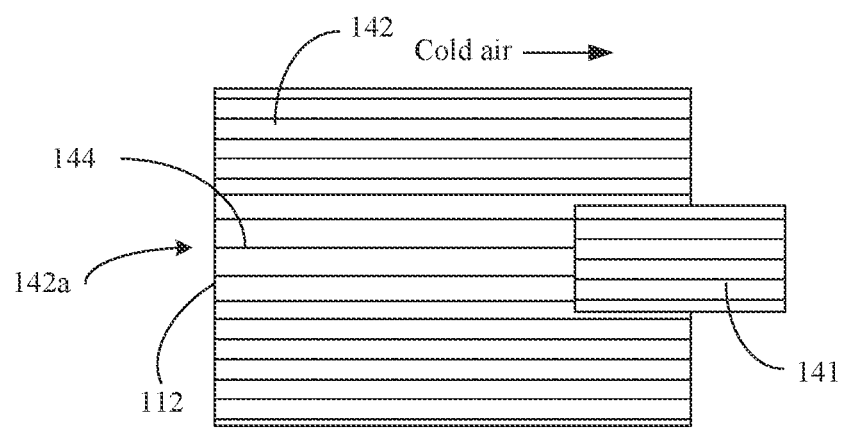
FIG. 12 is a schematic structural diagram 3 of a heat dissipation fin group according to Embodiment 1 of this disclosure.

FIG. 12 is a schematic structural diagram 3 of a heat dissipation fin group according to Embodiment 1 of this disclosure. In another possible implementation, fourth heat dissipation fins are further disposed in the cold air path 144, and a density of the fourth heat dissipation fins 144 is less than a density of the second heat dissipation fins, as shown in FIG. 12. Similar to the third heat dissipation fin 143, the fourth heat dissipation fin 144 in the cold air path 142a can increase a heat dissipation area of the entire second heat dissipation fin group 142, to assist heat dissipation of the second heat dissipation substrate 112. In addition, because a density of the fourth heat dissipation fins 144 is less than a density of the second heat dissipation fins, a relatively large notch exists between the fourth heat dissipation fins 144. Therefore, it can still be ensured that a cooling airflow can pass through the cold air path 142a to dissipate heat for the first heat dissipation fin group 141.

Figure 13:
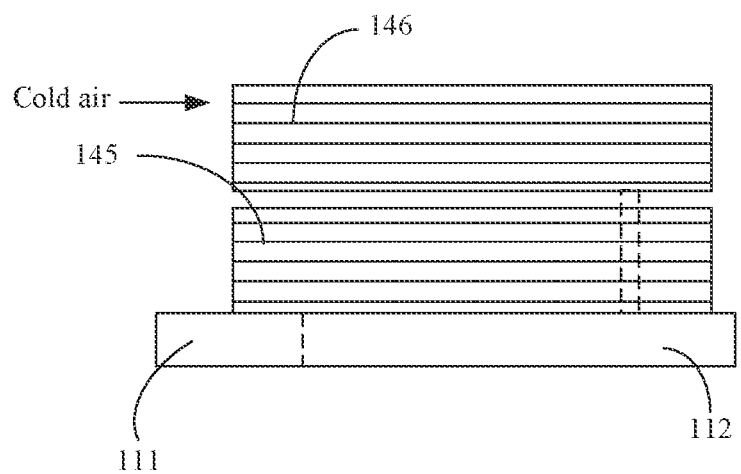
FIG. 13 is a schematic structural diagram 4 of a heat dissipation fin group according to Embodiment 1 of this disclosure.

When the first heat dissipation substrate 111 and the second heat dissipation substrate 112 have relatively small areas, space for accommodating the heat dissipation fin groups is limited, and the heat dissipation fin groups may alternatively be stacked when being disposed. FIG. 13 is a schematic structural diagram 4 of a heat dissipation fin group according to Embodiment 1 of this disclosure. As shown in FIG. 13, the heat sink further includes: a fifth heat dissipation fin group 145 used to dissipate heat for the first heat dissipation substrate 111 and a sixth heat dissipation fin group 146 used to dissipate heat for the second heat dissipation substrate 112, and the fifth heat dissipation fin group 145 and the sixth heat dissipation fin group 146 are stacked on a surface that is of the heat dissipation substrate and that is opposite to the heat conduction surface.

The fifth heat dissipation fin group 145 may be located between the sixth heat dissipation fin group 146 and the heat dissipation substrate, or the sixth heat dissipation fin group 146 may be located between the fifth heat dissipation fin group 145 and the heat dissipation substrate. In this way, the two heat dissipation fin groups are stacked from top to bottom in a direction perpendicular to the heat conduction surface. Therefore, each heat dissipation fin group may have a relatively large area, and is distributed on the entire heat dissipation substrate. A heat dissipation fin group relatively far away from the heat dissipation substrate may transfer heat with the heat dissipation substrate in a manner such as by using a heat pipe, to ensure heat dissipation of the heat dissipation substrate. Therefore, the heat dissipation fin groups respectively used to dissipate heat for the two heat dissipation substrates are stacked on the heat dissipation substrates from top to bottom, so that when an area of the heat dissipation substrate is relatively small and it is difficult to form an effective cold air path, height space above the heat dissipation substrate can be used to dispose the heat dissipation fin group, to ensure heat dissipation efficiency of the heat dissipation substrate.

Based on the foregoing embodiments, to further improve heat dissipation efficiency, a semiconductor cooling chip may be further disposed on the heat conduction surface of the at least one heat dissipation substrate, and the semiconductor cooling chip is in contact with a corresponding chip in the packaged chip. The semiconductor cooling chip is disposed on the heat conduction surface of the heat dissipation substrate, so that a heat transfer speed of the heat conduction surface may be increased, and heat dissipation efficiency of the heat sink may be improved by using a feature of electron mobility of a semiconductor. Therefore, heat dissipation of each chip in the packaged chip is facilitated, working of a chip is protected, and a service life of a chip is increased.

In this case, a semiconductor cooling chip may be disposed on heat conduction surfaces of some heat dissipation substrates, or a semiconductor cooling chip may be disposed on heat conduction surfaces of all heat dissipation substrates. A disposing manner and a quantity of semiconductor cooling chips may be freely set based on a specific heat dissipation requirement.

In addition, another type of thermoelectric cooler may alternatively be used to replace the semiconductor cooling chip, and a method for using the thermoelectric cooler is the same as that in the prior art. Details are not described herein again.

In addition, optionally, a heat conduction rate and heat conduction efficiency of the different heat dissipation substrates may be further reduced, and a heat insulation effect of the heat dissipation substrates may be improved by selecting a material of the connector. For example, a heat conduction rate of a material that the connector is made of may be less than a heat conduction rate of a material that the heat dissipation substrate is made of.

Specifically, a material such as stainless steel or zinc alloy having a low heat conduction coefficient may generally be selected for the connector. Compared with a material that the heat dissipation substrate is made of, a heat conduction speed of the selected material is relatively slow, and heat transfer between the different heat dissipation substrates may be further obstructed, so that a heat dissipation process of each chip is more independent, and it is avoided that a chip in the packaged chip that emits more heat interferes normal heat dissipation of a chip that emits less heat.

In this embodiment, the heat sink includes the heat dissipation substrate, the connector, and the fastener. The heat dissipation substrate is configured to dissipate heat for a packaged chip located on the circuit board, and the heat dissipation substrate is located on the surface that is of the packaged chip and that is opposite to the circuit board; and the heat dissipation substrate includes the first heat dissipation substrate and the second heat dissipation substrate, the first heat dissipation substrate and the second heat dissipation substrate each have the heat conduction surface that conducts heat with a chip in the packaged chip, different heat conduction surfaces correspond to different chips, the first end of the connector is fastened to the first heat dissipation substrate, the second end of the connector suspends on an outer side of the second heat dissipation substrate, and the fastener presses against the outer side of the first heat dissipation substrate, to prevent the first heat dissipation substrate from moving far away from the second heat dissipation substrate. When temperatures of chips below heat dissipation substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

Figure 14:
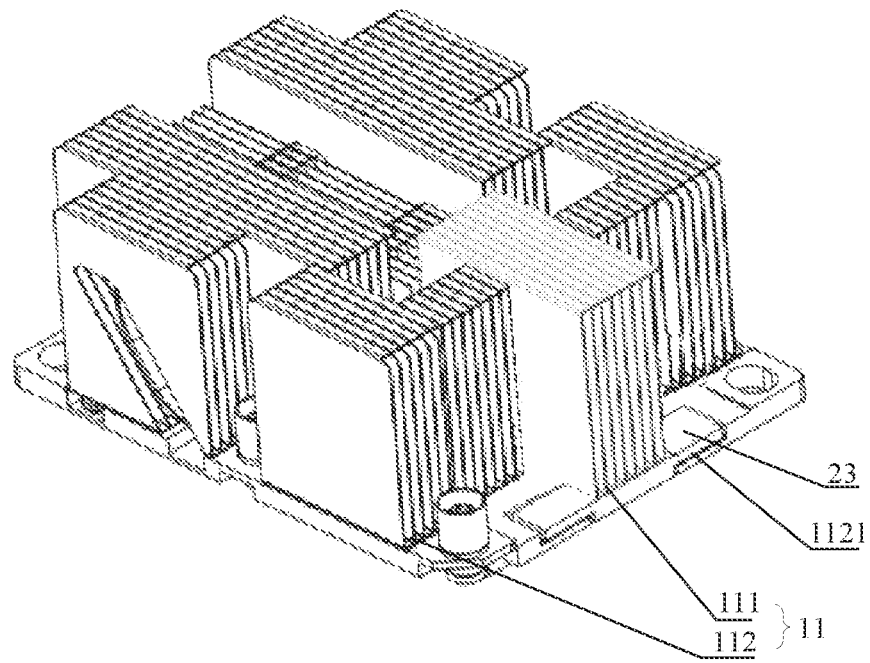
FIG. 14 is a schematic structural diagram of a heat sink according to Embodiment 2 of this disclosure.

FIG. 14 is a schematic structural diagram of a heat sink according to Embodiment 2 of this disclosure. In this embodiment, when heat of different chips in the packaged chip is dissipated, heat transfer between the different heat dissipation substrates may further be obstructed by using a material having a low heat conduction coefficient. As shown in FIG. 14, the heat sink includes a heat dissipation substrate 11. The heat dissipation substrate 11 is configured to dissipate heat for a packaged chip on a circuit board, and the heat dissipation substrate is located on a surface that is of the packaged chip and that is opposite to the circuit board.

The heat dissipation substrate 11 includes a first heat dissipation substrate 111 and a second heat dissipation substrate 112, the first heat dissipation substrate 111 and the second heat dissipation substrate 112 each have a heat conduction surface that conducts heat with a chip in the packaged chip, different heat conduction surfaces correspond to different chips, the first heat dissipation substrate 111 is connected to the second heat dissipation substrate 112 by using a connector 23, a heat conduction coefficient of the connector 23 is less than a heat conduction coefficient of the first heat dissipation sub-substrate 111, and the heat conduction coefficient of the connector 23 is less than a heat conduction coefficient of the second heat dissipation sub-strate 112.

In the heat sink, a plurality of heat dissipation substrates that dissipate heat for different chips are connected by using the connector 23 having a relatively low heat conduction coefficient. Because the heat conduction coefficient of the connector 23 configured to connect two neighboring heat dissipation substrates is less than that of the connected heat dissipation substrate, less heat is transferred between the neighboring heat dissipation substrates. When temperatures of chips below each heat dissipation sub-substrate are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of the chip having a relatively low temperature, and increasing a service lives of the packaged chip and an entire electronic product.

Specifically, a material such as stainless steel or zinc alloy having a low heat conduction coefficient may be selected for the connector 23. Compared with a material that the heat dissipation substrate is made of, a heat conduction speed of the selected material is relatively slow, and heat transfer between the different heat dissipation substrates may be further obstructed, so that a heat dissipation process of each chip is more independent, and it is avoided that a chip in the packaged chip that emits more heat interferes normal heat dissipation of a chip that emits less heat.

In an implementable manner of this disclosure, the heat conduction surfaces of the first heat dissipation substrate 111 and the second heat dissipation substrate 112 are both in a same plane. Because surfaces that are of chips in the packaged chip and that are away from the circuit board are all in the same plane, the heat conduction surfaces of the first heat dissipation substrate 111 and the second heat dissipation substrate 112 are both in the same plane. Therefore, this can ensure that the heat conduction surfaces of the heat dissipation substrates all are in contact with each chip in the packaged chip, and avoid that the heat dissipation substrates are undesirably in contact with the packaged chip.

In an implementable manner of this disclosure, a material that the connector 23 is made of is a heat-insulation material. The connector 23 is made of the heat-insulation material, and a heat transfer process of the neighboring first heat dissipation substrates 111 and second heat dissipation substrate 112 can be alleviated to the maximum extent, so that an approximate heat insulation state exists between the different heat dissipation substrates, heat emitted by a chip having a high temperature is prevented from transferring to a chip having a low temperature, and a service life of the chip is increased. A common heat-insulation material includes plastic, fiberglass, asbestos, or the like. Because plastic has relatively desirable heat insulation performance and is formed easily, plastic is a relatively preferable material that the connector is made of.

Optionally, to further reduce heat passing through the connector 23, a cross-sectional area of the connector 23 in a heat transfer direction is generally less than a cross-sectional area of a connected part formed when the first heat dissipation substrate 111 and the second heat dissipation substrate 112 are directly connected. A first connection surface may be defined as a surface that is on the first heat dissipation substrate 111 and that is opposite to the second heat dissipation substrate 112, and a second connection surface may be defined as a surface that is on the second heat dissipation substrate 112 and that is opposite to the first heat dissipation substrate 111. The cross-sectional area of the connector 23 in a heat conduction direction of the connector 23 should be less than an overlapped area of the first connection surface and the second connection surface. Generally, the connector 23 may be of an elongated shape or sheet-shaped, and is joined between the first heat dissipation substrate 111 and the second heat dissipation substrate 112.

It should be noted that the shape of the connector 23 is not limited to an elongated shape or a sheet shape, and may alternatively be another structural form having a relatively small cross-sectional area.

In an implementable manner of this disclosure, an arrangement groove 1121 is provided at a position that is on the second heat dissipation substrate 112 and that corresponds to the connector 23, and the arrangement groove 1121 is used to avoid the connector 23. In this way, because the connector 23 is connected to the second heat dissipation substrate 112, to avoid interference between the connector 23 and the second heat dissipation substrate 112 and further stably fasten the connector 23, the second heat dissipation substrate 112 is provided with the arrangement groove 1121. A size and a depth of the arrangement groove 1121 both match the connector 23, so that the connector 23 can be placed in the arrangement groove 1121 to avoid interference between the connector 23 and the second heat dissipation substrate 112. In addition, a shape of the arrangement groove 1121 can fasten and position the connector 23 in a direction parallel to the heat dissipation substrate.

In an implementable manner of this disclosure, there are at least two connectors 23. When there are a plurality of connectors 23, the plurality of connectors may be symmetrically disposed on two sides of the first heat dissipation substrate 111, to strengthen stability of connection between the first heat dissipation substrate 111 and the second heat dissipation substrate 112.

Optionally, the connector 23 may be directly soldered to the second heat dissipation substrate 112 by using soldering tin, to implement fastening of the connector and the second heat dissipation substrate. Specifically, when the soldering tin is used for soldering, a material of the connector 23 usually may be a metal material such as stainless steel or zinc alloy that can combine with the soldering tin. In addition, the connector 23 may alternatively be glued to the second heat dissipation substrate 112 by using an adhesive, to implement fastening of the connector 23 and the second heat dissipation substrate 112.

Figure 15:
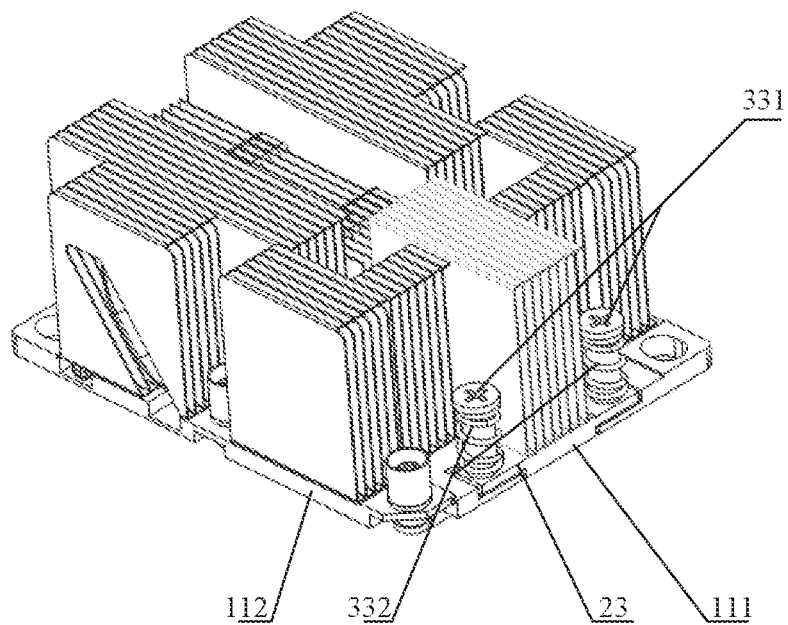
FIG. 15 is another schematic structural diagram of a heat sink according to Embodiment 2 of this disclosure.

When the connector 23 is connected to the second heat dissipation substrate 112 by using soldering tin or an adhesive, the entire heat sink is not detached easily. To implement detachable design of the heat sink, in another implementable manner, the connector 23 may be securely connected to the second heat dissipation substrate 112 by using a structure such as a fastening screw. FIG. 15 is another schematic structural diagram of a heat sink according to Embodiment 2 of this disclosure. As shown in FIG. 15, the connector 23 is provided with a first through hole, and a second through hole is provided at a position that is on the second heat dissipation substrate 112 and that corresponds to the first through hole. In this case, the heat sink further includes a fastening screw 331, the fastening screw 331 passes through the first through hole and the second through hole, the first heat dissipation substrate 111 is located between a head portion of the fastening screw 331 and the second heat dissipation substrate 112, and a tail portion of the fastening screw 331 is securely connected to the second heat dissipation substrate 112, to connect the first heat dissipation substrate 111 to the second heat dissipation substrate 112.

Because the fastening screw 331 used to connect the connector 23 to the second heat dissipation substrate 112 implements fastening and connection by relying on a common threaded connection, a connection is relatively reliable. In addition, in a threaded connection, a through hole of the connector 23 or the second heat dissipation substrate 112 is generally in point contact with or is in line contact with a thread of the fastening screw 331, and a contact surface is relatively small. Therefore, this can further reduce a heat conduction speed of the connector 23 and the second heat dissipation substrate 112, and ensure heat insulation performance of the first heat dissipation substrate 111 and the second heat dissipation substrate 112.

Further, based on the foregoing embodiment, the heat sink further includes an elastic member 332, and two ends of the elastic member 332 respectively press between the head portion of the fastening screw 331 and the first heat dissipation substrate 111, so that the first heat dissipation substrate 111 is in contact with the packaged chip under an elastic force of the elastic member 332.

Because the elastic member 332 can press against both the fastening screw 331 and the first heat dissipation substrate 111, and the fastening screw 331 and the second heat dissipation substrate 112 are securely connected, and maintain fixed relative positions, under the force of the elastic member 332, the first heat dissipation substrate 111 is pressed to the second heat dissipation substrate 112 under the force of the elastic member 332, to generate a floating effect. This can prevent the first heat dissipation substrate 111 from moving far away from the second heat dissipation substrate 112, and the first heat dissipation substrate 111 and the second heat dissipation substrate 112 can keep being in contact with the packaged chip as much as possible. To be specific, the heat conduction surfaces of the first heat dissipation substrate 111 and the second heat dissipation substrate 112 are coplanar.

In an implementable manner of this disclosure, the second heat dissipation substrate 112 is connected to the connector 23 by using heat insulation glue. The heat insulation glue is disposed between the connector 23 and the second heat dissipation substrate 112, to obstruct heat transfer between the connector 23 and the second heat dissipation substrate 112, and further avoid heat transfer between the first heat dissipation substrate 111 and the second heat dissipation substrate 112.

In addition, in this embodiment, a relationship of relative positions of the second heat dissipation substrate 112 and the first heat dissipation substrate 111 is similar to that in Embodiment 1. In an implementable manner of this disclosure, the second heat dissipation substrate 112 is provided with a notch. At least a part of the first heat dissipation substrate 111 is located in the notch, and an outer-edge shape of the part of the first heat dissipation substrate 111 that is located in the notch matches a shape of the notch, as shown in FIG. 6, FIG. 7, and FIG. 8.

In an implementable manner of this disclosure, the first heat dissipation substrate 111 is completely located in the notch.

In an implementable manner of this disclosure, the second heat dissipation substrate 112 encloses the outer side of the first heat dissipation substrate 111 and forms a closed shape, as shown in FIG. 9.

In an implementable manner of this disclosure, the heat sink further includes: a first heat dissipation fin group 141 used to dissipate heat for the first heat dissipation substrate 111 and a second heat dissipation fin group 142 used to dissipate heat for the second heat dissipation substrate 112, the first heat dissipation fin group 141 is located on a surface that is of the first heat dissipation substrate 111 and that is opposite to the heat conduction surface, the second heat dissipation fin group 142 is located on a surface that is of the second heat dissipation substrate 112 and that is opposite to the heat conduction surface, a cold air path 142a is formed inside the second heat dissipation fin group 142, the second heat dissipation fin group 142 is provided with second heat dissipation fins, the second heat dissipation fin is located on two sides of the cold air path 142a, and the first heat dissipation fin group 141 is located on the cold air path 142a or an extension line of the cold air path 142a, as shown in FIG. 10.

Optionally, a third heat dissipation fin 143 is further disposed in the cold air path 142a, and a height of the third heat dissipation fin 143 is less than a height of the second heat dissipation fin, as shown in FIG. 11.

Optionally, a fourth heat dissipation fin 144 is further disposed in the cold air path 142a, and a density of the fourth heat dissipation fins 144 is less than a density of the second heat dissipation fins, as shown in FIG. 12.

Optionally, the heat sink further includes: a fifth heat dissipation fin group 145 used to dissipate heat for the first heat dissipation substrate 111 and a sixth heat dissipation fin group 146 used to dissipate heat for the second heat dissipation substrate 112, and the fifth heat dissipation fin group 145 and the sixth heat dissipation fin group 146 are stacked on a surface that is of the heat dissipation substrate and that is opposite to the heat conduction surface.

The fifth heat dissipation fin group 145 is located between the sixth heat dissipation fin group 146 and the heat dissipation substrate, or the sixth heat dissipation fin group 146 is located between the fifth heat dissipation fin group 145 and the heat dissipation substrate, as specifically shown in FIG. 13.

Optionally, a semiconductor cooling chip is disposed on the heat conduction surface of the at least one heat dissipation substrate, and the semiconductor cooling chip is in contact with a corresponding chip in the packaged chip.

In this embodiment, the heat sink includes the heat dissipation substrate. The heat dissipation substrate is configured to dissipate heat for a packaged chip located on the circuit board, and the heat dissipation substrate is located on the surface that is of the packaged chip and that is opposite to the circuit board; and the heat dissipation substrate includes the first heat dissipation substrate and the second heat dissipation substrate, the first heat dissipation substrate and the second heat dissipation substrate each have the heat conduction surface that conducts heat with a chip in the packaged chip, different heat conduction surfaces correspond to different chips, the first heat dissipation substrate is connected to the second heat dissipation substrate by using the connector, the heat conduction coefficient of the connector is less than the heat conduction coefficient of the first heat dissipation sub-substrate, and the heat conduction coefficient of the connector is less than the heat conduction coefficient of the second heat dissipation substrate. In this way, because neighboring heat dissipation substrates are connected by using the connector having a relatively low heat conduction coefficient, when temperatures of chips below heat dissipation substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

Figure 16:
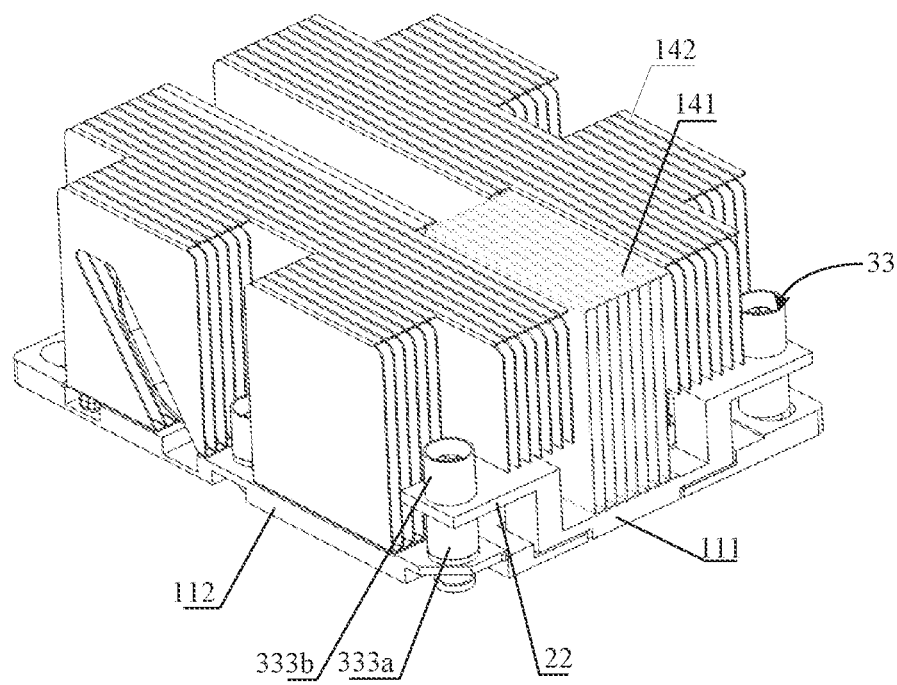
FIG. 16 is a schematic structural diagram of a heat sink according to Embodiment 3 of this disclosure.

FIG. 16 is a schematic structural diagram of a heat sink according to Embodiment 3 of this disclosure. An overall structure of the heat sink in this embodiment is similar to that in Embodiment 1. Details are not described herein again. A difference lies in that the fastening screw is not selected as the fastener configured to fasten the connector and the second heat dissipation substrate, and instead a double-layer stud structure is used. Specifically, as shown in FIG. 16, the fastener 33 includes: a first positioning stud 333a and a second positioning stud 333b; and a bottom end of the first positioning stud 333a is connected to the second heat dissipation substrate 112, an axial direction of the first positioning stud 333a is perpendicular to a plane in which the second heat dissipation substrate 112 lies, the second positioning stud 333b can be screwed into a top end of the first positioning stud 333a, and the second end of the connector 22 is fastened at a screwed position of the first positioning stud 333a and the second positioning stud 333b.

A double-layer stud structure is used, the second end of the connector 22 is fastened between the first positioning stud 333a and the second positioning stud 333b, and the first positioning stud 333a is fastened on the second heat dissipation substrate 112. In this way, a connection between the connector 22 and the second heat dissipation substrate 112 is indirectly implemented by using the stud. A contact surface of the connector 22 and the positioning stud is generally relatively small, and there is usually a gap. Therefore, a heat transfer speed and heat transfer efficiency of the connector 22 and the positioning stud are both relatively low, and heat transfer to different heat dissipation substrates through the connector can be relatively desirably avoided.

In an implementable manner of this disclosure, a perpendicular distance between the second end of the connector 22 and the plane in which the second heat dissipation substrate 112 lies is different from a perpendicular distance between the first end of the connector 22 and the plane in which the second heat dissipation substrate 112 lies.

Specifically, because the connector 22 may be connected to the second heat dissipation substrate 112 by using a structure such as a double-layer positioning stud, to avoid another connection structure, the second end and the first end of the connector 22 may generally located at positions away from the plane in which the second heat dissipation substrate 112 lies by different distances, so that the second end of the connector 22 avoids the connection structure for fastening.

Because heights of the second end and the first end of the connector 22 are different, the first end of the connector 22 may be connected to the second end of the connector 22 by using a bending segment. In addition, the connector 22 may alternatively be a structure such as an arc that may satisfy a requirement that two ends have a height difference. Details are not described herein again.

In this embodiment, the heat sink includes the heat dissipation substrate, the connector, and the fastener. The heat dissipation substrate is configured to dissipate heat for a packaged chip located on the circuit board, and the heat dissipation substrate is located on the surface that is of the packaged chip and that is opposite to the circuit board; and the heat dissipation substrate includes the first heat dissipation substrate and the second heat dissipation substrate, the first heat dissipation substrate and the second heat dissipation substrate each have a heat conduction surface that conducts heat with a chip in the packaged chip, different heat conduction surfaces correspond to different chips, the first end of the connector is fastened to the first heat dissipation substrate, the second end of the connector suspends on an outer side of the second heat dissipation substrate, and the fastener presses against an outer side of the first heat dissipation substrate, to prevent the first heat dissipation substrate from moving far away from the second heat dissipation substrate. The fastener includes: a first positioning stud and a second positioning stud; and a bottom end of the first positioning stud is connected to the second heat dissipation substrate, an axial direction of the first positioning stud is perpendicular to a plane in which the second heat dissipation substrate lies, the second positioning stud can be screwed into a top end of the first positioning stud, and the second end of the connector is fastened at a position at which the first positioning stud is screwed into the second positioning stud. When temperatures of chips below heat dissipation substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

Figure 17:
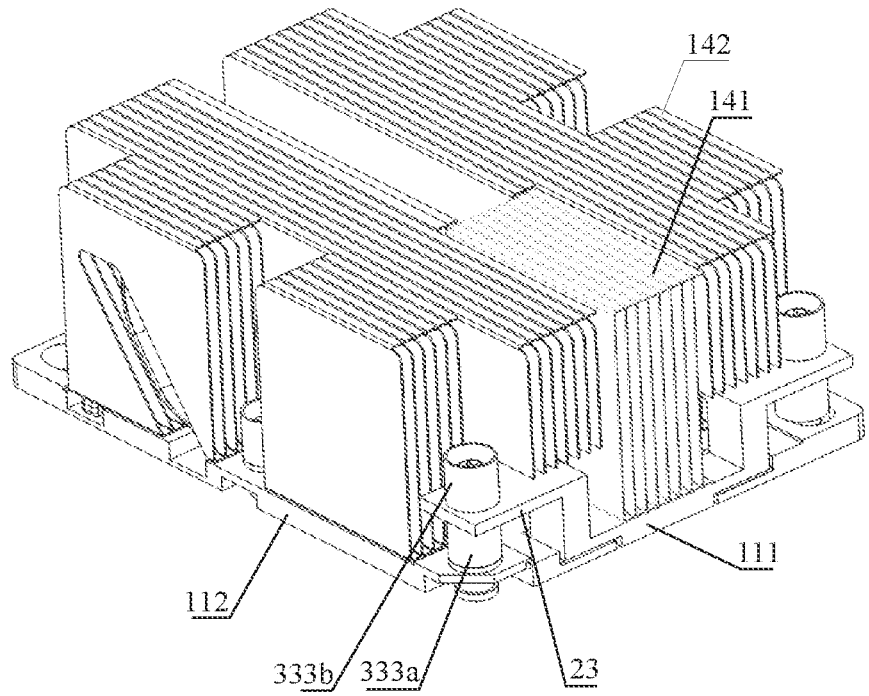
FIG. 17 is a schematic structural diagram of a heat sink according to Embodiment 4 of this disclosure.

FIG. 17 is a schematic structural diagram of a heat sink according to Embodiment 4 of this disclosure. An overall structure and a working principle of the heat sink in this embodiment are similar to that in Embodiment 2. Details are not described herein again. A difference lies in that when the connector is detachably connected to the second heat dissipation substrate, a double-layer stud structure similar to that in Embodiment 3 is used. Specifically, as shown in FIG. 17, the heat sink includes: a first positioning stud 333a and a second positioning stud 333b. A bottom end of the first positioning stud 333a is connected to the second heat dissipation substrate 112, an axial direction of the first positioning stud 333a is perpendicular to a plane in which the second heat dissipation substrate 112 lies, the second positioning stud 333b can be screwed into a top end of the first positioning stud 333a, the first end of the connector 23 is fastened to the first heat dissipation substrate 111, and the second end of the connector 23 is fastened at a screwed position of the first positioning stud 333a and the second positioning stud 333b.

In an implementable manner of this disclosure, a perpendicular distance between the second end of the connector 23 and the plane in which the second heat dissipation substrate 112 lies is different from a perpendicular distance between the first end of the connector 23 and the plane in which the second heat dissipation substrate 112 lies.

Because the connector 23 may be connected to the second heat dissipation substrate 112 by using a structure such as a double-layer positioning stud, to avoid another connection structure, the second end and the first end of the connector 23 may generally located at positions away from the plane in which the second heat dissipation substrate 112 lies by different distances, so that the second end of the connector 23 avoids the connection structure for fastening.

In an implementable manner of this disclosure, the first end of the connector 23 is connected to the second end of the connector 23 by using a bending segment. In addition, the connector 23 may alternatively be a structure such as an arc that may satisfy a requirement that two ends have a height difference. Details are not described herein again.

In this embodiment, the heat sink includes the heat dissipation substrate. The heat dissipation substrate is configured to dissipate heat for a packaged chip located on a circuit board, and the heat dissipation substrate is located on a surface that is of the packaged chip and that is opposite to the circuit board; and the heat dissipation substrate includes a first heat dissipation substrate and a second heat dissipation substrate, the first heat dissipation substrate and the second heat dissipation substrate each have a heat conduction surface that conducts heat with a chip in the packaged chip, different heat conduction surfaces correspond to different chips, the first heat dissipation substrate is connected to the second heat dissipation substrate by using a connector, a heat conduction coefficient of the connector is less than a heat conduction coefficient of the first heat dissipation sub-substrate, and the heat conduction coefficient of the connector is less than a heat conduction coefficient of the second heat dissipation substrate. The fastener includes: a first positioning stud and a second positioning stud; and a bottom end of the first positioning stud is connected to the second heat dissipation substrate, an axial direction of the first positioning stud is perpendicular to a plane in which the second heat dissipation substrate lies, the second positioning stud can be screwed into a top end of the first positioning stud, and the second end of the connector is fastened at a position at which the first positioning stud is screwed into the second positioning stud. In this way, because neighboring heat dissipation substrates are connected by using the connector having a relatively low heat conduction coefficient, when temperatures of chips below heat dissipation substrates are different, heat emitted by each chip does not transfer to another chip by using the heat dissipation substrate. To be specific, in a process of using the heat sink, heat emitted by a chip having a high temperature does not transfer to a chip having a low temperature, thereby effectively increasing a service life of a chip having a relatively low temperature, and increasing a service life of an electronic product.

In addition, an embodiment of this disclosure further provides a heat dissipation apparatus, including at least two heat sinks according to any one of Embodiment 1 or Embodiment 4 and at least one heat pipe, where each heat sink corresponds to a packaged chip; and two ends of the heat pipe are respectively connected to heat dissipation substrates of different heat sinks, to transfer heat of a heat sink corresponding to a packaged chip in a heat emitting state to a heat sink corresponding to a packaged chip that does not emit heat.

Figure 18:
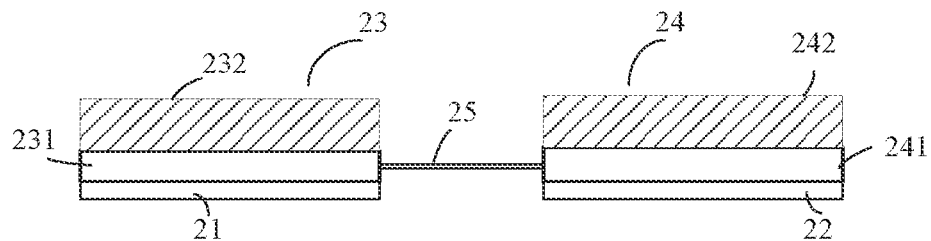
FIG. 18 is a specific schematic structural diagram of a heat dissipation apparatus according to Embodiment 5 of this disclosure.

FIG. 18 is a specific schematic structural diagram of a heat dissipation apparatus according to Embodiment 5 of this disclosure. As shown in FIG. 18, the heat dissipation apparatus provided in this embodiment is configured to dissipate heat for a first packaged chip 21 and a second packaged chip 22. The heat dissipation apparatus provided in this embodiment specifically includes: a first heat sink 23, a second heat sink 24, and a heat pipe 25. The first heat sink 23 is located above the first packaged chip 21, and is configured to dissipate heat for the first packaged chip 21. The second heat sink 24 is located above the second packaged chip 22, and is configured to dissipate heat for the second packaged chip 22. The heat pipe 25 is connected between the first heat sink 23 and the second heat sink 24. The first heat sink 23 includes a heat dissipation substrate 231 and a heat dissipation fin 232 provided on the heat dissipation substrate 231; and the second heat sink 24 includes a heat dissipation substrate 241 and a heat dissipation fin 242 provided on the heat dissipation substrate 241.

Assuming that the first packaged chip 21 is in a heat emitting state, and the second packaged chip 22 does not emit heat, the heat pipe 25 may transfer heat of the first heat sink 23 to the second heat sink 24, so that the second heat sink 24 assists heat dissipation of the first packaged chip 22. The second packaged chip 22 is not in a working or heat emitting state, and heat dissipation is not required temporarily.

In this embodiment, the heat dissipation apparatus includes at least two heat sinks and at least one heat pipe. Each heat sink corresponds to a packaged chip; and two ends of the heat pipe are respectively connected to heat dissipation substrates of different heat sinks, to transfer heat of a heat sink corresponding to a packaged chip in a heat emitting state to a heat sink corresponding to a packaged chip that does not emit heat. Heat of a packaged chip that is in a working and heat emitting state is transferred, by using the connection between the heat sink and the heat pipe, to a heat sink corresponding to a packaged chip that does not work or does not emit heat, to more effectively facilitate temperature reduction of different packaged chips.

An embodiment of this disclosure further provides a heat dissipation system. The heat dissipation system includes: at least one heat sink according to any one of the foregoing embodiments and at least one packaged chip, where each heat sink corresponds to a packaged chip, and the heat sink is used to dissipate heat for the packaged chip.

Figure 19:
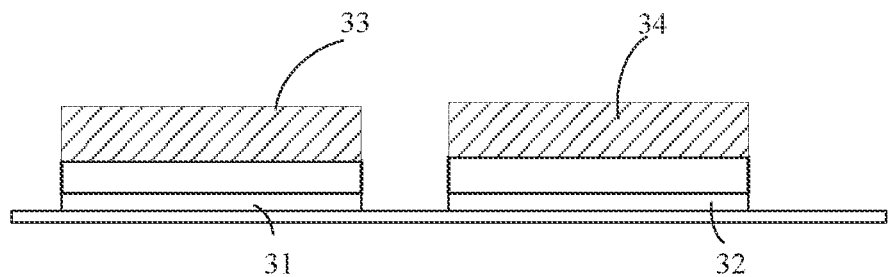
FIG. 19 is a specific schematic structural diagram of a heat dissipation system according to Embodiment 6 of this disclosure.

FIG. 19 is a specific schematic structural diagram of a heat dissipation system according to Embodiment 6 of this disclosure. As shown in FIG. 19, the heat dissipation system provided in this embodiment is configured to dissipate heat for a first packaged chip 31 and a second packaged chip 32. The heat dissipation system provided in this embodiment specifically includes: the first packaged chip 31, the second packaged chip 32, a first heat sink 33, and a second heat sink 34, where the first heat sink 33 is located above the first packaged chip 31 and is configured to dissipate heat for the first packaged chip 31, and the second heat sink 34 is located above the second packaged chip 32 and is configured to dissipate heat for the second packaged chip 32.

An implementation principle and a technical effect of the heat dissipation system in this embodiment are similar to that in the foregoing embodiments. Details are not described herein again.

An embodiment of this disclosure further provides a communications device, including at least one heat sink according to any one of Embodiment 1 to Embodiment 4, at least one packaged chip, and at least one circuit board, where each circuit board is provided with at least one packaged chip; and each heat sink corresponds to a packaged chip, and the heat sink is used to dissipate heat for the packaged chip.

Figure 20:
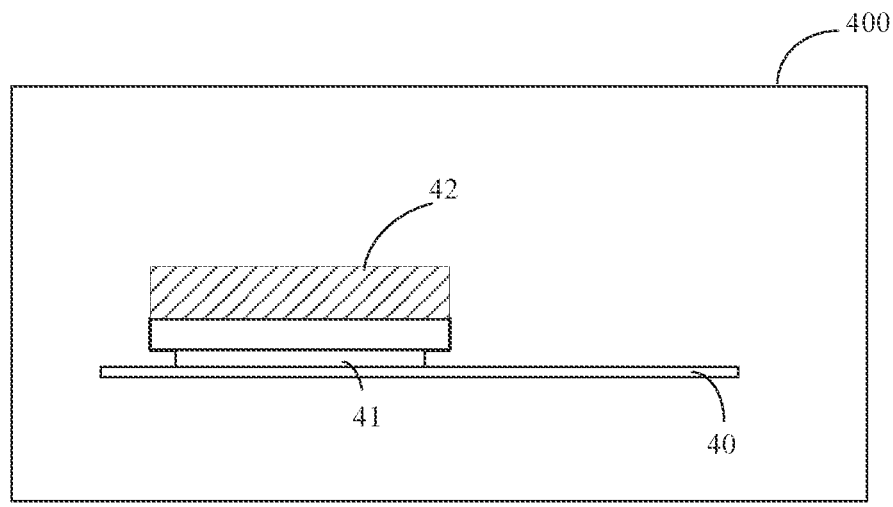
FIG. 20 is a specific schematic structural diagram of a communications device according to Embodiment 7 of this disclosure.

FIG. 20 is a specific schematic structural diagram of a communications device according to Embodiment 7 of this disclosure. As shown in FIG. 20, a communications device 400 provided in this embodiment internally includes a circuit board 40. The circuit board 40 is provided with a packaged chip 41, the packaged chip 41 is electrically connected to a circuit on the circuit board 40, and the packaged chip 41 is provided with a heat sink 42 configured to dissipate heat for the packaged chip 41. A structure and an implementation principle of the heat sink 42 are both similar to that of the heat sink in the foregoing embodiments. Details are not described herein again.

An implementation principle and a technical effect of the heat sink of the communications device in this embodiment are similar to that of the heat sink in the foregoing embodiments. Details are not described herein again.

The invention claimed is:

1. A heat sink, comprising:
a heat dissipation substrate, a connector, and a fastener, wherein:
the heat dissipation substrate is configured to dissipate heat for a packaged chip located on a circuit board, wherein the heat dissipation substrate is located on a surface that is of the packaged chip and that is opposite to the circuit board, and wherein the packaged chip includes a plurality of chips packaged in one package body; and
the heat dissipation substrate comprises a first heat dissipation substrate and a second heat dissipation substrate, wherein the first heat dissipation substrate and the second heat dissipation substrate each have a heat conduction surface that conducts heat with a chip in the plurality of chips, wherein different heat conduction surfaces correspond to different chips in the plurality of chips, wherein a first end of the connector is fastened to the first heat dissipation substrate, wherein a second end of the connector suspends on an outer side of the second heat dissipation substrate, wherein the second heat dissipation substrate is connected to the second end of the connector by using heat insulation material and wherein the fastener presses against an outer side of the first heat dissipation substrate to prevent the first heat dissipation substrate from moving away from the second heat dissipation substrate.

2. The heat sink according to claim 1, wherein the heat conduction surfaces of the first heat dissipation substrate and the second heat dissipation substrate are both in a same plane.

3. The heat sink according to claim 2, wherein the connector is of an elongated shape.

4. The heat sink according to claim 2, wherein the connector is sheet-shaped.

5. The heat sink according to claim 1, wherein an arrangement groove is provided at a position that is on the second heat dissipation substrate and that corresponds to the connector, and wherein the arrangement groove is used to avoid the connector.

6. The heat sink according to claim 1, wherein the connector is provided with a first through hole, and wherein a second through hole is provided at a position that is on the second heat dissipation substrate and that corresponds to the first through hole; and
wherein the fastener further comprises a fastening screw, wherein the fastening screw passes through the first through hole and the second through hole, wherein the first heat dissipation substrate is located between a head portion of the fastening screw and the second heat dissipation substrate, and wherein a tail portion of the fastening screw is securely connected to the second heat dissipation substrate to connect the first heat dissipation substrate to the second heat dissipation substrate.

7. The heat sink according to claim 6, wherein the fastener further comprises an elastic member, and wherein two ends of the elastic member respectively press between the head portion of the fastening screw and the first heat dissipation substrate, so that the first heat dissipation substrate is in contact with the packaged chip under an elastic force of the elastic member.

8. The heat sink according to claim 1, wherein the heat insulation material is heat insulation glue.

9. The heat sink according to claim 1, wherein the fastener comprises:
a first positioning stud; and
a second positioning stud, wherein a bottom end of the first positioning stud is connected to the second heat dissipation substrate, wherein an axial direction of the first positioning stud is perpendicular to a plane in which the second heat dissipation substrate lies, wherein the second positioning stud can be screwed into a top end of the first positioning stud, and wherein the second end of the connector is fastened at a position at which the first positioning stud is screwed into the second positioning stud.

10. The heat sink according to claim 9, wherein a perpendicular distance between the second end of the connector and the plane in which the second heat dissipation substrate lies is different from a perpendicular distance between the first end of the connector and the plane in which the second heat dissipation substrate lies.

11. The heat sink according to claim 10, wherein the first end of the connector is connected to the second end of the connector by using a bending segment.

12. The heat sink according to claim 1, wherein the second heat dissipation substrate is provided with a notch, wherein at least a part of the first heat dissipation substrate is located in the notch, and wherein an outer-edge shape of the part of the first heat dissipation substrate that is located in the notch matches a shape of the notch.

13. The heat sink according to claim 12, wherein the first heat dissipation substrate is completely located in the notch.

14. The heat sink according to claim 1, wherein the second heat dissipation substrate encloses the outer side of the first heat dissipation substrate and forms a closed shape.

15. The heat sink according to claim 1, further comprising:
a first heat dissipation fin group used to dissipate heat for the first heat dissipation substrate; and
a second heat dissipation fin group used to dissipate heat for the second heat dissipation substrate, wherein the first heat dissipation fin group is located on a surface that is of the first heat dissipation substrate and that is opposite to the heat conduction surface, wherein the second heat dissipation fin group is located on a surface that is of the second heat dissipation substrate and that is opposite to the heat conduction surface, wherein a cold air path is formed inside the second heat dissipation fin group, wherein the second heat dissipation fin group is provided with second heat dissipation fins, wherein the second heat dissipation fins are located on two sides of the cold air path, and wherein the first heat dissipation fin group is located in the cold air path or on an extension line of the cold air path.

16. The heat sink according to claim 15, wherein third heat dissipation fins are further disposed in the cold air path, and wherein a height of the third heat dissipation fin is less than a height of the second heat dissipation fin.

17. The heat sink according to claim 15, wherein fourth heat dissipation fins are further disposed in the cold air path, and wherein a density of the fourth heat dissipation fins is less than a density of the second heat dissipation fins.

18. The heat sink according to claim 1, further comprising:
a fifth heat dissipation fin group used to dissipate heat for the first heat dissipation substrate; and
a sixth heat dissipation fin group used to dissipate heat for the second heat dissipation substrate, wherein the fifth heat dissipation fin group and the sixth heat dissipation fin group are stacked on a surface that is of the heat dissipation substrate and that is opposite to the heat conduction surface; and wherein:
the fifth heat dissipation fin group is located between the sixth heat dissipation fin group and the heat dissipation substrate, or
the sixth heat dissipation fin group is located between the fifth heat dissipation fin group and the heat dissipation substrate.

19. The heat sink according to claim 1, wherein a heat conduction rate of a material that the connector is made of is less than a heat conduction rate of a material that the heat dissipation substrate is made of.

20. A heat dissipation system, comprising:
at least one heat sink; and
at least one packaged chip, wherein each heat sink corresponds to a packaged chip and is used to dissipate heat for the packaged chip, and wherein each heat sink comprises:
a heat dissipation substrate, a connector, and a fastener, wherein:
the heat dissipation substrate is configured to dissipate heat for a packaged chip located on a circuit board, wherein the packaged chip includes a plurality of chips packaged in one package body, and wherein the heat dissipation substrate is located on a surface that is of the packaged chip and that is opposite to the circuit board; and
the heat dissipation substrate comprises a first heat dissipation substrate and a second heat dissipation substrate, wherein the first heat dissipation substrate and the second heat dissipation substrate each have a heat conduction surface that conducts heat with a chip in the plurality of chips, wherein different heat conduction surfaces correspond to different chips in the plurality of chips, wherein a first end of the connector is fastened to the first heat dissipation substrate, wherein a second end of the connector suspends on an outer side of the second heat dissipation substrate, wherein the second heat dissipation substrate is connected to the second end of the connector by using heat insulation material and wherein the fastener presses against an outer side of the first heat dissipation substrate to prevent the first heat dissipation substrate from moving away from the second heat dissipation substrate.

21. A communications device, comprising:
at least one heat sink;
at least one packaged chip; and
at least one circuit board, wherein:
each circuit board is provided with at least one packaged chip;
each heat sink corresponds to a packaged chip and is used to dissipate heat for the packaged chip; and
each heat sink comprises:
a heat dissipation substrate, a connector, and a fastener, wherein:
the heat dissipation substrate is configured to dissipate heat for a packaged chip located on a circuit board, wherein the packaged chip includes a plurality of chips packaged in one package body, and wherein the heat dissipation substrate is located on a surface that is of the packaged chip and that is opposite to the circuit board; and
the heat dissipation substrate comprises a first heat dissipation substrate and a second heat dissipation substrate, wherein the first heat dissipation substrate and the second heat dissipation substrate each have a heat conduction surface that conducts heat with a chip in the plurality of chips, wherein different heat conduction surfaces correspond to different chips in the plurality of chips, wherein a first end of the connector is fastened to the first heat dissipation substrate, wherein a second end of the connector suspends on an outer side of the second heat dissipation substrate, wherein the second heat dissipation substrate is connected to the second end of the connector by using heat insulation material and wherein the fastener presses against an outer side of the first heat dissipation substrate to prevent the first heat dissipation substrate from moving away from the second heat dissipation substrate.

* * * * *